United States Patent
Williamson et al.

(10) Patent No.: US 10,927,663 B2
(45) Date of Patent: Feb. 23, 2021

(54) METHOD OF FAULT DETECTION AND RECOVERY IN A TUBING STRING LOCATED IN A HYDROCARBON WELL, AND APPARATUS FOR SAME

(71) Applicant: NCS MULTISTAGE INC., Calgary (CA)

(72) Inventors: Patrick Williamson, Calgary (CA); Ramin Tajallipour, Calgary (CA)

(73) Assignee: NCS MULTISTAGE INC., Calgary (CA)

( * ) Notice: Subject to any disclaimer, the term of this patent is extended or adjusted under 35 U.S.C. 154(b) by 92 days.

(21) Appl. No.: 16/262,165

(22) Filed: Jan. 30, 2019

(65) Prior Publication Data
US 2019/0235007 A1   Aug. 1, 2019

Related U.S. Application Data

(60) Provisional application No. 62/624,082, filed on Jan. 30, 2018.

(51) Int. Cl.
*E21B 47/12* (2012.01)
*E21B 34/06* (2006.01)
*G01R 31/52* (2020.01)

(52) U.S. Cl.
CPC ............ *E21B 47/12* (2013.01); *E21B 34/066* (2013.01); *G01R 31/52* (2020.01)

(58) Field of Classification Search
CPC ........ E21B 34/06; E21B 34/066; E21B 34/16; E21B 43/162; E21B 47/12; G01R 31/52
See application file for complete search history.

(56) References Cited

U.S. PATENT DOCUMENTS

| | | | |
|---|---|---|---|
| 4,295,795 A | 10/1981 | Gass et al. | |
| 5,937,945 A | 8/1999 | Bussear et al. | |
| 6,374,913 B1* | 4/2002 | Robbins | E21B 47/13 166/66 |
| 6,615,916 B1* | 9/2003 | Vachon | E21B 47/00 166/250.01 |

(Continued)

FOREIGN PATENT DOCUMENTS

| | | |
|---|---|---|
| CA | 2948273 | 5/2017 |
| WO | 2001/65056 A1 | 9/2001 |
| WO | 2016/181154 A1 | 11/2016 |

*Primary Examiner* — Robert E Fuller
(74) *Attorney, Agent, or Firm* — Andrus Intellectual Property Law, LLP

(57) ABSTRACT

A method of fault detection and recovery in a tubing string located in a hydrocarbon well is described, the tubing string having a plurality of valves, each valve having a control unit, each control unit being connected in series to a power-line providing power and communication, each of the control units being independently controllable. The method includes: detecting a short circuit, fault or failure in one of the control units of the tubing string via an output of the power-line; causing individual control units to be selectively isolated from the power-line via a circuit interrupting device; and determining one or more control units associated with the short circuit, fault or failure via the output of the power-line while individual control units are selectively isolated from the power-line. A method of fault protection in a tubing string, and an apparatus and system for the same are also described.

20 Claims, 13 Drawing Sheets

(56) References Cited

U.S. PATENT DOCUMENTS

| | | | |
|---|---|---|---|
| 6,715,550 B2 | 4/2004 | Vinegar et al. | |
| 8,476,786 B2* | 7/2013 | Shaw | E21B 17/003 |
| | | | 307/31 |
| 8,923,095 B2* | 12/2014 | Pettersen | G01V 11/002 |
| | | | 367/56 |
| 10,007,260 B2* | 6/2018 | Hoefel | G05B 23/0218 |
| 10,287,851 B2* | 5/2019 | El Mallawany | E21B 34/10 |
| 10,323,481 B2 | 6/2019 | Pratt et al. | |
| 2009/0295597 A1* | 12/2009 | Grimseth | E21B 34/16 |
| | | | 340/853.1 |
| 2010/0237698 A1* | 9/2010 | Smithson | E21B 34/06 |
| | | | 307/38 |
| 2013/0043048 A1* | 2/2013 | Joseph | E21B 43/128 |
| | | | 166/381 |
| 2015/0369023 A1 | 12/2015 | MacPhail et al. | |
| 2016/0053587 A1* | 2/2016 | Eriksen | H02H 11/001 |
| | | | 166/65.1 |
| 2017/0130557 A1 | 5/2017 | Pratt et al. | |
| 2019/0257173 A1 | 8/2019 | Pratt et al. | |

* cited by examiner

METHOD OF FAULT DETECTION AND RECOVERY IN A TUBING STRING LOCATED IN A HYDROCARBON WELL, AND APPARATUS FOR SAME

RELATED APPLICATION DATA

The present disclosure claims priority to, and the benefit of, provisional U.S. patent application No. 62/624,082, filed Jan. 30, 2018, the content of which is incorporated herein by reference.

TECHNICAL FIELD

The present disclosure relates to tubing strings located in hydrocarbon wells for oil recovery, and in particular, to a method of fault detection and recovery in a tubing string located in a hydrocarbon well, a method of fault protection in a tubing string located in a hydrocarbon well, and an apparatus and system for same.

BACKGROUND

Wellbores used in injection wells receive injection sleeves carrying mechanical, power and data equipment used in oil recovery operations. Wellbores uses in production wells can also receive mechanical, power and data equipment. The wellbore environment is challenging due to environmental conditions, remoteness and access restrictions. Accordingly, various design constraints are involved in the design of injection sleeves and supporting control systems, which often vary between applications due to differences in the formation in which the wellbore is located and production objectives, among other factors.

SUMMARY

The present disclosure relates to a method of fault detection and recovery in a tubing string located in a hydrocarbon well, a method of fault protection in a tubing string located in a hydrocarbon well, and an apparatus and system for same. The teachings of the present disclosure can be used to detect faults in downhole telemetry systems, recover from faults in downhole telemetry systems and/or protect against faults in downhole telemetry systems, depending on the embodiment. The teachings of the present disclosure may be applied to a short circuit, fault or failure in a control unit of downhole telemetry systems.

In accordance with one embodiment of the present disclosure, there is provided a method of fault detection and recovery in a tubing string located in a hydrocarbon well, the tubing string having a plurality of valves, each valve having a control unit, each control unit being connected in series to a power-line providing power and communication, each of the control units being independently controllable, the method comprising: detecting a short circuit, fault or failure in one of the control units of the tubing string via an output of the power-line; causing individual control units to be selectively isolated from the power-line via a circuit interrupting device; and determining one or more control units associated with the short circuit, fault or failure via the output of the power-line while individual control units are selectively isolated from the power-line.

In some examples, the short circuit, fault or failure is detected in response to a determination that one or more characteristics of the output of the power-line has changed by more than a threshold amount.

In some examples, the one or more characteristics of the output of the power-line is a current of the power-line.

In some examples, the method is performed by a master controller coupled to the control units.

In some examples, the master controller is located above the hydrocarbon well.

In some examples, the control units communicate with the master controller via half-duplex communication.

In some examples, the master controller is a programmable logic controller.

In some examples, the tubing string is an injection string.

In some examples, the method comprises: after the determining one or more control units associated with the short circuit, fault or failure, selectively isolated the one or more control units associated with the short circuit, fault or failure are from the power-line.

In some examples, the method comprises: before detecting the short circuit, fault or failure: causing a condition of the valves of the tubing string to be set in accordance with a first valve configuration; and causing an injection fluid to be injected into the tubing string in accordance with a first valve configuration; after the determining one or more control units associated with the short circuit, fault or failure: causing a condition of the valves of the tubing string to be set in accordance with a second valve configuration, wherein the second valve configuration excludes as possibilities operating states in which the one or more control units associated with the short circuit, fault or failure selectively isolated from the power-line are controlled; and causing the injection fluid to be injected into the tubing string in accordance with a second valve configuration, wherein each of the first valve configuration is defined by a condition of the valves in which each valve in the plurality of valves is in either the fully open position or the fully closed position.

In some examples, the individual control units are selectively isolated in an isolation sequence.

In some examples, the isolation sequence is from a toe to a heel of the hydrocarbon well.

In some examples, each control unit has a respective circuit interrupting device, wherein the power-line comprises a main power-line and a plurality of branch power-lines connected to the main power-line, wherein the control units for the valves are connected to a respective branch power-line.

In some examples, wherein each circuit interrupting device comprises: first circuit interrupting device located in a main power-line to interrupt current in the main power-line when an amperage threshold is exceeded; and a second circuit interrupting device located in a respective branch line from the main power-line connected to a power supply of a respective control unit of a respective valve to interrupt current in the respective branch line when an amperage threshold is exceeded.

In some examples, the amperage thresholds of the first circuit interrupting device and second circuit interrupting device of each circuit interrupting device decreases in a descending order from a heel of the hydrocarbon well to a toe of the hydrocarbon well.

In accordance with another embodiment of the present disclosure, there is provided a controller for controlling control units of a tubing string located in a hydrocarbon well, the tubing string having a plurality of valves, each valve having a control unit, each control unit being connected in series to a power-line providing power and communication, each of the control units being independently controllable, the controller comprising: a processor; and a memory coupled the at least one processor, the memory having tangibly stored thereon executable instructions for execution by the processor that, when executed by the processor, cause the controller to: detect a short circuit, fault or failure in one of the control units of the tubing string via an output of the power-line; cause individual control units to be isolated from the power-line via a circuit interrupting device; and determine one or more control units is associated with the short circuit, fault or failure via the output of the power-line while individual control units are isolated from the power-line.

In accordance with a further embodiment of the present disclosure, there is provided a downhole fault protection system for a tubing string located in a hydrocarbon well, the tubing string having a plurality of valves, each valve having a control unit, each control unit being connected in series to a power-line providing power and communication, each of the control units being independently controllable, the system comprising: a main power-line having a plurality of branch lines connected thereto; a control unit for a valve connected to each of the branch lines; a line protection circuit for each of the control units, each line protection circuit comprising a pair of circuit interrupting devices, a first circuit interrupting device in each pair located in the main power-line to interrupt current in the main power-line when an amperage threshold is exceeded and a second circuit interrupting device in each pair located in a respective branch line from the main power-line that extends to a power supply of a respective control unit of a respective valve to interrupt current in the respective branch line when an amperage threshold is exceeded; wherein the amperage thresholds of the first and second circuit interrupting devices decreases in a descending order from a heel of the hydrocarbon well to a toe of the hydrocarbon well, enabling valves to be selectively isolated in order from the toe to the heel by increasing a current applied to the line protection circuits.

In some examples, the difference in amperage thresholds between adjacent pair of circuit interrupting devices is 50-200 mA, preferably 100-150 mA, and more preferably 100-110 mA.

In some examples, the line protection circuit further comprises a NTC (Negative temperature coefficient) thermistor adjacent to the first circuit interrupting device in the main power-line, wherein the NTC thermistor of the line protection circuits are matched such that the operating temperatures of the first circuit interrupting devices differ by less than a threshold amount.

In some examples, the first and circuit interrupting devices are fuses.

In accordance with yet a further embodiment of the present disclosure, there is provided a downhole fault protection system for multiple stages of downhole valves in a well, comprising: a main power-line having a plurality of branch lines connected thereto; a control unit for a valve connected to each of the branch lines; a line protection circuit for each of the control units, each line protection circuit comprising a circuit interrupting device for isolating the valve from the main power-line when an amperage threshold at the control unit is exceeded; wherein the amperage thresholds of the circuit interrupting devices decreases in a descending order from a heel of the hydrocarbon well to a toe of the hydrocarbon well, enabling valves to be selectively isolated in order from the toe to the heel by increasing a current applied to the line protection circuits.

In accordance with yet a further embodiment of the present disclosure, there is provided a downhole fault protection system comprising a series of paired circuit interrupting devices, a first circuit interrupting device in each pair located in a main power-line to interrupt current in the main power-line when an amperage threshold is exceeded and a second circuit interrupting device in each pair located in a respective branch line from the main power-line that extends to a power supply of a respective control unit of a respective flow communication station to interrupt current in the respective branch line when an amperage threshold is exceeded, wherein the amperage thresholds of the circuit interrupting devices decreases in a descending order from a heel of the injection well to a toe of the injection well. When a short circuit, control unit fault or control unit failure occurs, the current in the main power-line can be steadily increased to sequentially trigger/blow the paired fuses from the toe to the heel of the injection well until the control unit having the short circuit, control unit fault or control unit failure is disconnected, and the operability of the injection well is restored.

In accordance with a further aspect of the present disclosure, there is provided a controller configured to perform the methods described herein. In some embodiments, the controller comprises at least one processor and a memory coupled the at least one processor, the memory having tangibly stored thereon executable instructions for execution by the at least one processor that, when executed by the at least one processor, cause the controller to perform at least parts of the methods described herein.

In accordance with yet a further aspect of the present disclosure, there is provided a non-transitory machine readable medium having tangibly stored thereon executable instructions for execution by at least one processor of a controller, wherein the executable instructions, when executed by the at least one processor, cause the controller to perform at least parts of the methods described herein.

DESCRIPTION OF EXAMPLE EMBODIMENTS

Figure 1:
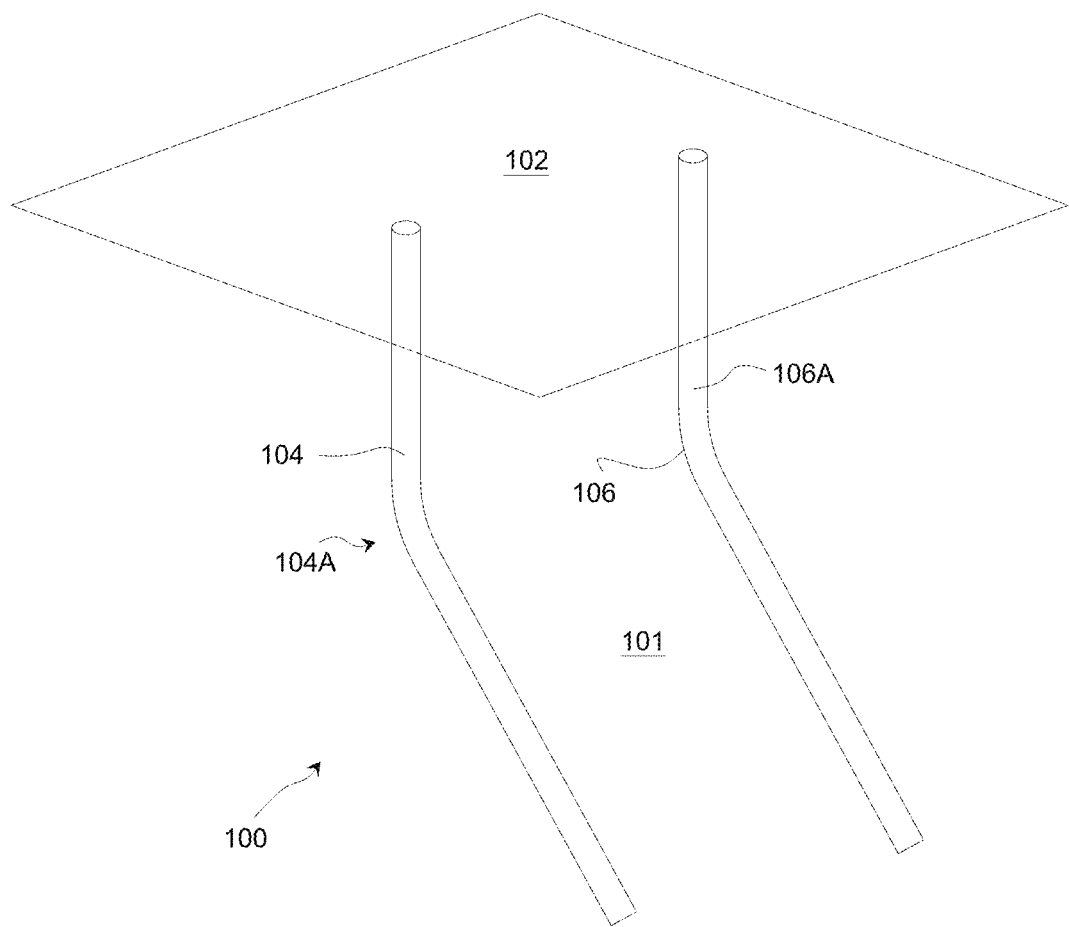
FIG. 1 is a schematic diagram of a first example apparatus with which example embodiments of the present disclosure may be applied.

The present disclosure is made with reference to the accompanying drawings, in which embodiments are shown. However, many different embodiments may be used, and thus the description should not be construed as limited to the embodiments set forth herein. Rather, these embodiments are provided so that this disclosure will be thorough and complete. Wherever possible, the same reference numbers are used in the drawings and the following description to refer to the same elements, and prime notation is used to indicate similar elements, operations or steps in alternative embodiments. Separate boxes or illustrated separation of functional elements of illustrated systems and devices does not necessarily require physical separation of such functions, as communication between such elements may occur by way of messaging, function calls, shared memory space, and so on, without any such physical separation. As such, functions need not be implemented in physically or logically separated platforms, although they are illustrated separately for ease of explanation herein. Different devices may have different designs, such that although some devices implement some functions in fixed function hardware, other devices may implement such functions in a programmable processor with code obtained from a machine-readable medium. Lastly, elements referred to in the singular may be plural and vice versa, except where indicated otherwise either explicitly or inherently by context.

System for Operating Hydrocarbon Wells

Figure 6:
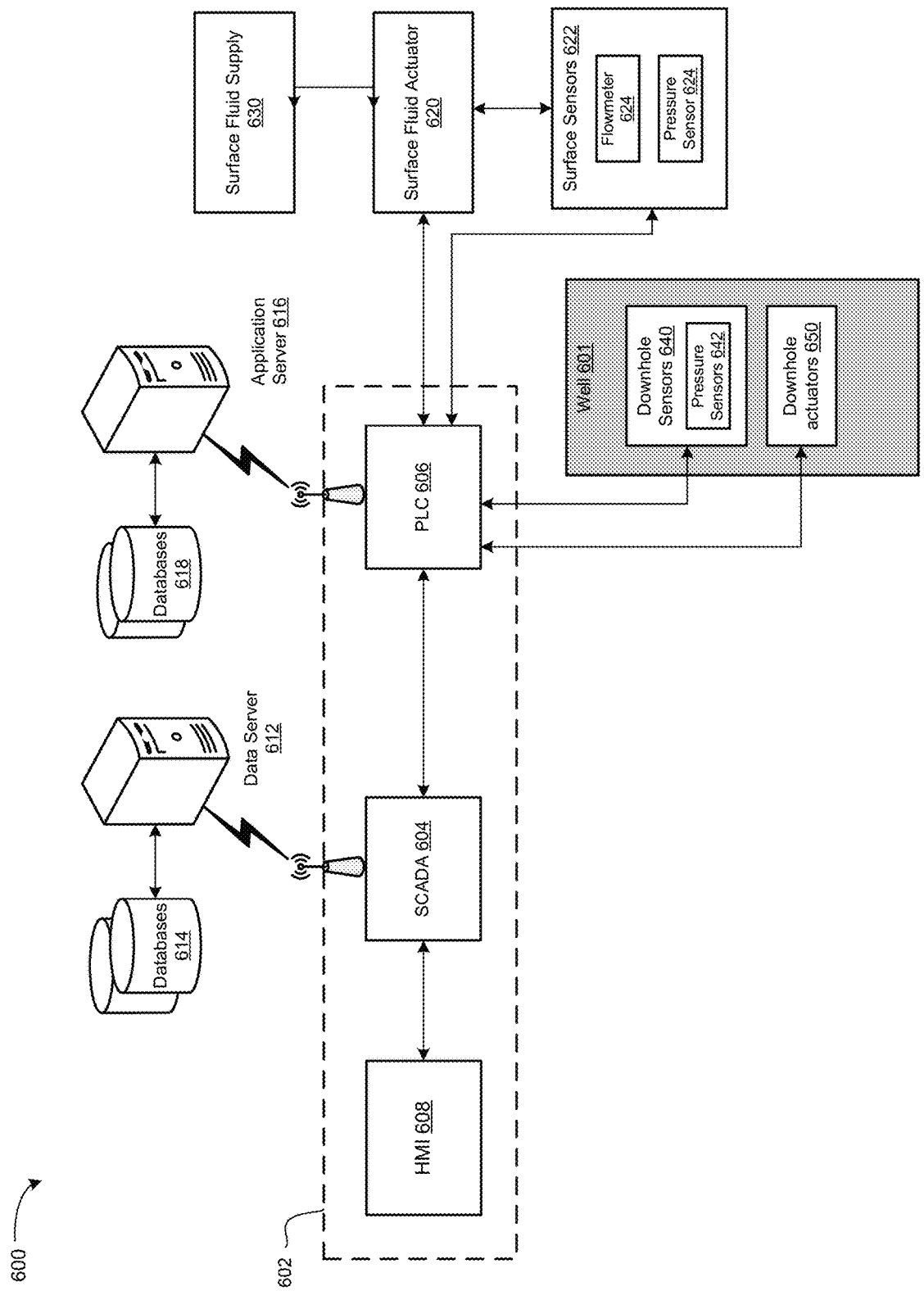
FIG. 6 is a schematic diagram of a system for operating hydrocarbon wells in accordance with an example embodiment of the present disclosure.

Reference is first made to FIG. 6 which illustrates a system 600 for operating hydrocarbon wells, e.g. oil wells 601, in accordance with one embodiment of the present disclosure. The system 600 may be used to operate one or more oil wells 601 in the same or different hydrocarbon reservoirs (e.g., petroleum or oil and gas reservoirs). The oil wells 601 may comprise injection wells, production wells, or a combination thereof. The system 600 comprises a number of control systems 602 (only one of which is shown in FIG. 6). Each control system 602 may control multiple wells 601 or a single well 601. The control systems 602 are located at the site of the respective wells 601. The control systems 602 comprise a supervisory control and data acquisition (SCADA) control system 604 coupled to a controller, such as a programmable logic controller (PLC) 606. A human machine interface (HMI) 608 is coupled to the SCADA control system 604. The HMI 608 typically comprises a visual interface provided by a display that provides a graphical user interface (GUI) that displays operating data and information about the respective well 601, and an input interface for receiving user input provided by one or more input devices such as keyboard and mouse. The HMI 608 may optionally comprise a microphone and a speaker, for example, for speech recognition.

The PLC 606 is coupled to downhole sensors 640 and downhole actuators 650 coupled to a respective valve (not shown) in a plurality of valves of a tubing string installed in the oil well 200. The tubing string may be any suitable type of tubing string including, but not limited to, an injection string, a production string or a lift gas conduit among other possibilities. The downhole sensors 640 sense one or more conditions at a respective valve. The downhole sensors 640 may comprise at least one pressure sensor 642 for each valve in the tubing string and optionally at least one temperature sensor for each valve in the tubing string. The PLC 606 is typically coupled to the downhole sensors 640 and the downhole actuators 650 via a wired communication path. The downhole actuators 650 are electronically controlled and may be actuated to open or close the respective valves many times.

The PLC 606 may also be coupled to a fluid actuator 620 located at the surface, such as a surface pump when the injection fluid is a liquid such as water or a compressor when the injection fluid is a gas, when the PLC 606 controls an injection well to maintain pressure, or cause a displacement process, in a hydrocarbon reservoir in a subterranean formation. The displacement process may be a secondary recovery process, such as waterflood, gas lift, natural gas flood or immiscible gas flood, or an EOR process, such as enriched miscible natural gas flood, miscible $CO_2$ flood, chemically enhanced water flood or water alternating gas (WAG) flood among other possibilities. The fluid actuator 620 may be a pump, compressor and/or flow regulator depending on the type of injection fluid being used, coupled to a fluid supply 630 located at the surface. The injection fluid may be water or a liquid that comprises substantially of water or compressed gas, such as $CO_2$, among other possibilities. The PLC 606 is also coupled to sensors 622 located at the surface that senses one or more parameters (or characteristics) of a fluid supplied to the respective well 601. The surface sensors 622 comprise a surface flowmeter 624 that measures a flow rate of an injection fluid and a pressure sensor 624 that measures a pressure of the injection fluid.

An additive supply and/or treatment supply (not shown) may also be provided. The additive supply and/or treatment supply may be connected to the PLC 606 and provides a source of a compound or composition that may be used with the injection fluid or instead of the injection fluid including, but not limited to one or more of, water, low salinity water, a dry gas, solvent, miscible gas, tracer, proppant, blocking agent, relative permeability modifying agent, surfactant, nanoparticulate or other additive which may be absorbed into the formation/reservoir. The additive supply and/or treatment supply may be connected to a mixer which is connected to the fluid supply 630 for mixing the compound or composition with the injection fluid, or may be connected directly to the fluid actuator 620 for directly injecting the compound or composition.

The PLC 606 may communicate with an application server 616 via a wired or wireless (e.g., cellular, Wi-Fi®, etc.) communication path, and with one or more databases 618 via the data server 616. The application server 616 may provide control information, such as optimization information, for operating the wells 601, namely for controlling the valves of the tubing string. The PLC 606 stores sensor data and derived data and information, such as injection data (e.g., flow rates and/or volumes) and/or production data (e.g., flow rates and/or volumes), relating to the operation of the respective wells 601. The PLC 606 communicates such data and information to the application server 616, which may store the data and information in the databases 618 as historical data for each of the wells 601. The historical data may comprise sensor data, operating settings or parameters such as valve position data relating to the open or closed state of the valves of the tubing string (e.g., a state of the tubing string or well 601), and derived data and information, such as production data over time (e.g., a time log). The data and information may comprise a time log of pressure data, temperature data, valve position/state (i.e., open or closed), and possibly derived flow rate or volume through each valve and/or possibly an interval specific reservoir characterization.

The SCADA control system 604 is typically used to communicate to or with an operator of the well 601. The system 600 is operated by the PLC 606 and/or the application server 616. The PLC 606 communicates with and provides the SCADA control system 604 with data and information relating to the operation of the respective wells 601. Typically, only a subset of the data and information of the PLC 606 is provided to the SCADA control system 604, such as a time filtered sample of one or more elements of the data and information mentioned above. The SCADA control system 604 may communicate with a data server 612 via a wired or wireless (e.g., cellular, Wi-Fi® etc.) communication path, and with one or more databases 614 via the data server 612. The SCADA control system 604 may provide the data server 612 with data and information, relating to the operation of the respective wells 601, which may store the data and information in the databases 614 as historical data for each of the wells 601.

Figure 7:
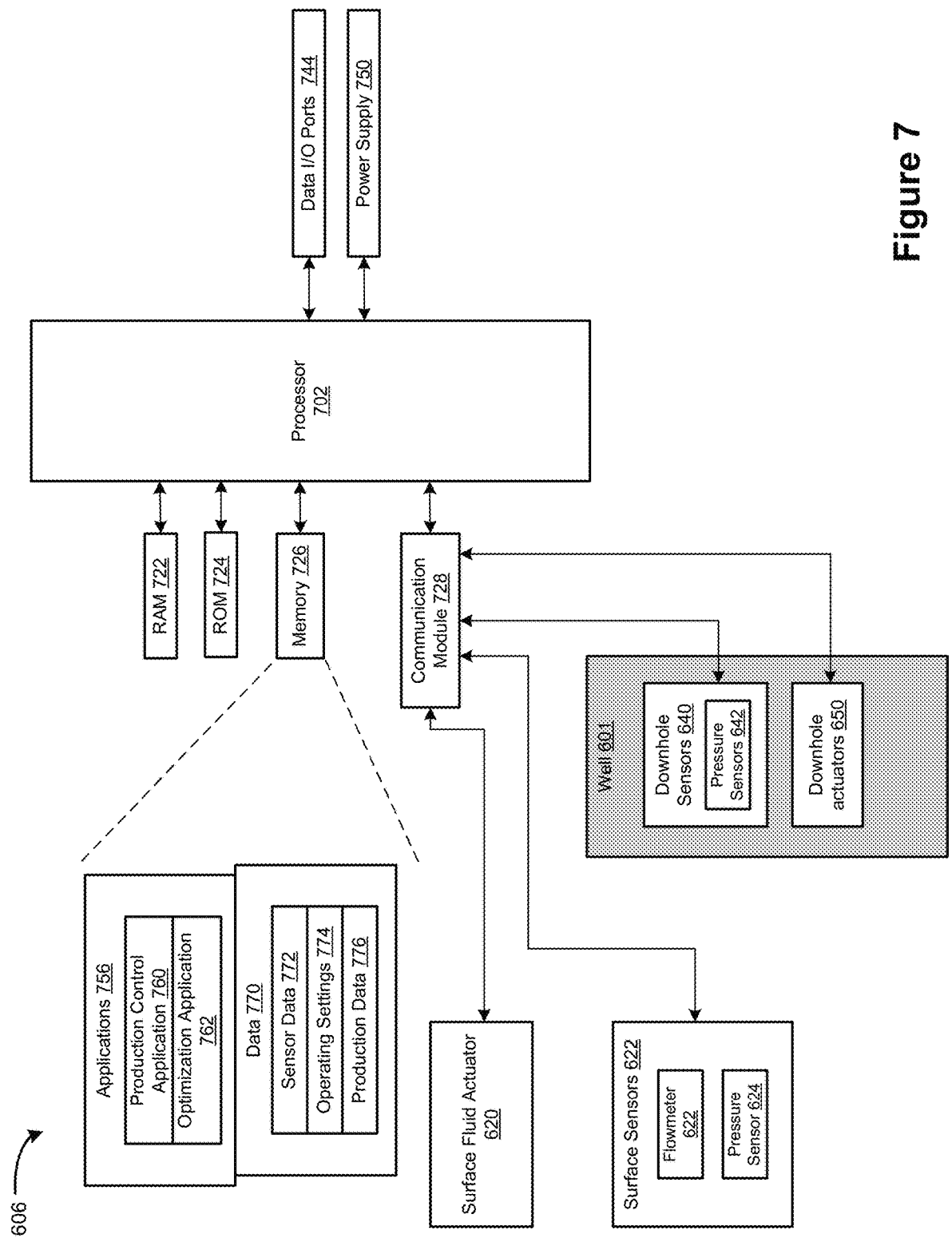
FIG. 7 is a block diagram of a programmable logical controller of the system of FIG. 6 in accordance with an example embodiment of the present disclosure.

Reference is next made to FIG. 7 which illustrates the components of a controller, such as PLC 606, of the system 600 of FIG. 6 in accordance with one example embodiment of the present disclosure. The PLC 606 comprises at least one processor 702 (such as a microprocessor) which controls the overall operation of the PLC 606. The processor 702 is coupled to a plurality of components via a communication bus (not shown) which provides a communication path between the components and the processor 702.

The processor 702 is coupled to RAM 722, ROM 724, persistent (non-volatile) memory 726 such as flash memory, and a communication module 728 for communication with the surface fluid actuator 620, surface sensors 622, downhole sensors 640 and downhole actuators 650. The processor 702 is also coupled to one or more data ports 744 such as serial data ports for data I/O (e.g., USB data ports), and a power supply 750.

The communication module 728 provides wired and/or wireless communication capabilities for communicating with an application server 616, surface fluid actuator 620, surface sensors 622, downhole sensors 640 and downhole actuators 650. Typically the communication module 728 is coupled to the downhole sensors 640 and downhole actuators 650 via a wired connection, such as a shared power and data line given space constraints and interference problems. The communication module 728 may comprise a wireless transceiver allowing the PLC 606 to communicate via one or any combination of cellular, Wi-Fi®, Bluetooth® or other short-range wireless communication protocol such as NFC, IEEE 802.15.7a (also referred to as UltraWideband (UVEB)), Z-Wave, ZigBee, ANT/ANT+ or infrared (e.g., Infrared Data Association (IrDA)). The PLC 606 may use the communication module 728 to access the application server 616 via one or more communications networks, such as the Internet. The application server 616 may be located behind a firewall (not shown).

Operating system software 752 executed by the processor 702 is stored in the persistent memory 726 but may be stored in other types of memory devices, such as ROM 724 or similar storage element. A number of applications 756 executable by the processor 702 are also stored in the persistent memory 726 including a production control application 760, which may operate the respective well 601 in accordance with optimized operating settings or parameters based on sensor data acquired from the respective well 601 and determined by an optimization application 762 of the application server 616 and pushed down to the PLC 606. Alternatively, the optimization application may be installed and run by the PLC 606. The optimization application may be a machine learning or artificial intelligence based application. The memory 726 also stores a variety of data 770 including sensor data 772 acquired by the surface sensors 622 and downhole sensors 640, operating settings 774 such as optimized operating settings or parameters including, but not limited to valve position data relating to the open or closed state of the valves of the tubing string (e.g., a state of the tubing string or well 601), and production data 776.

System software, software modules, specific device applications, or parts thereof, may be temporarily loaded into a volatile store, such as RAM 722, which is used for storing runtime data variables and other types of data or information. Communication signals received by the PLC 606 may also be stored in RAM 722. Although specific functions are described for various types of memory, this is merely one example, and a different assignment of functions to types of memory may be used in other embodiments.

Figure 8:
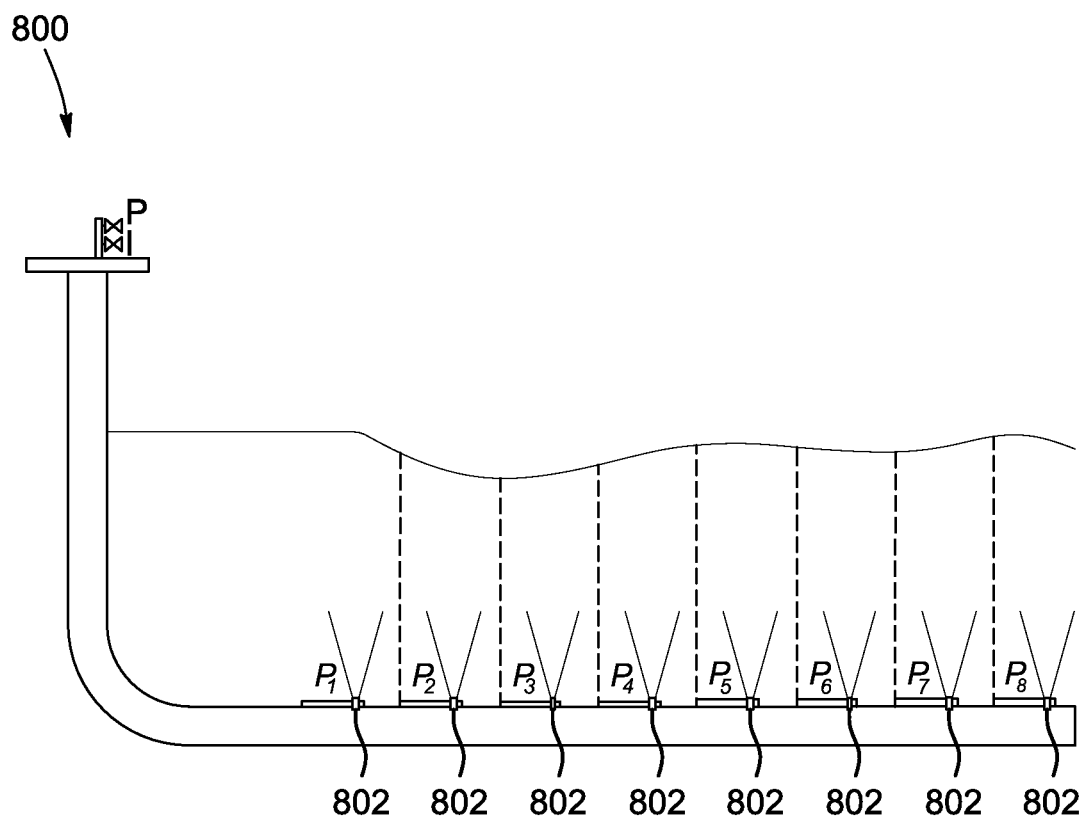
FIG. 8 is a schematic illustration of an example injection well with which example embodiments of the present disclosure may be applied.

FIG. 8 is a schematic illustration of an example horizontal injection well having a tubing string, i.e. an injection string 800, installed therein with which example embodiments of the present disclosure may be applied. The injection string 800 comprises a plurality of flow communication stations (or also known as valves). In the example of FIG. 8, the injection string 800 has 8 valves. However, any number of valves may be present. Each of the valves 802 is equipped with at least one pressure sensor for measuring a pressure of the formation in which the injection string 800 is located, denoted $p_1, p_2 \ldots p_8$, at the location of the respective valve 802. Each valve has an actuator 650 adapted to change a position or the state of respective valve 802, from either open or closed. Each of the valves 802 may be separately opened or closed. The surface sensors 622 comprise a surface flowmeter that measures the flow rate of an injection fluid at the surface and pressure sensor that measures a pressure of the injection fluid at the surface. An operating state of the well 601 is a valve configuration in which at least one of the valves 802 is disposed in the fully open position. For n valves 802, there are $2^n-1$ operating states (i.e., $2^n$ total states less the non-operating state in which all valves 802 are disposed in the fully closed position. The particular valves 802 that are disposed in the fully opened position and fully closed position is unique to each operating state of the well 601.

The controllable input parameters of the PLC 606 are the flow rate of the injection fluid at the surface, denoted I, the pressure of the injection fluid at the surface, denoted P, and the position or the state of valves 80, denoted $s_1, s_2 \ldots s_8$.

The condition (also referred to state or positon) of each valve is either fully open or fully closed. The measurable parameters are the pressure of the injection fluid at the surface (e.g., at the surface pump), the flow rate of the pressure of the injection fluid at the surface (e.g., at the surface pump), and the pressures at the location of each valve 802 (e.g., in proximity of each valve 802). Each valve 802 is sometimes referred to a stage of the tubing string, e.g. injection string 800.

Example Tubing String for Injection Well

Referring to FIG. 1, there is provided a hydrocarbon producing system 100 including an injection well 104 and a production well 106. The injection well 104 includes a wellbore 104A for injecting an injection fluid from the surface 102 and into the subterranean formation 101. The production well 106 includes a wellbore 106A for receiving hydrocarbon material that is displaced and driven by the injection fluid, and conducting the received hydrocarbon material to the surface. In some embodiments, the injection fluid is water or at least a substantial fraction of the injection fluid is water. In other embodiments, the injection fluid is a gas such as, for example, enriched field gas or carbon dioxide.

Each one of the wellbores 104A, 106A, independently, may be straight, curved, or branched and may have various wellbore sections. A wellbore section is an axial length of a wellbore. A wellbore section may be characterized as vertical or horizontal even though the actual axial orientation may vary from true vertical or true horizontal, and even though the axial path may tend to corkscrew or otherwise vary. The term horizontal, when used to describe a wellbore section, refers to a horizontal or highly deviated wellbore section as understood in the art, such as, for example, a wellbore section having a longitudinal axis that is between 70 and 110 degrees from vertical.

Figure 2:
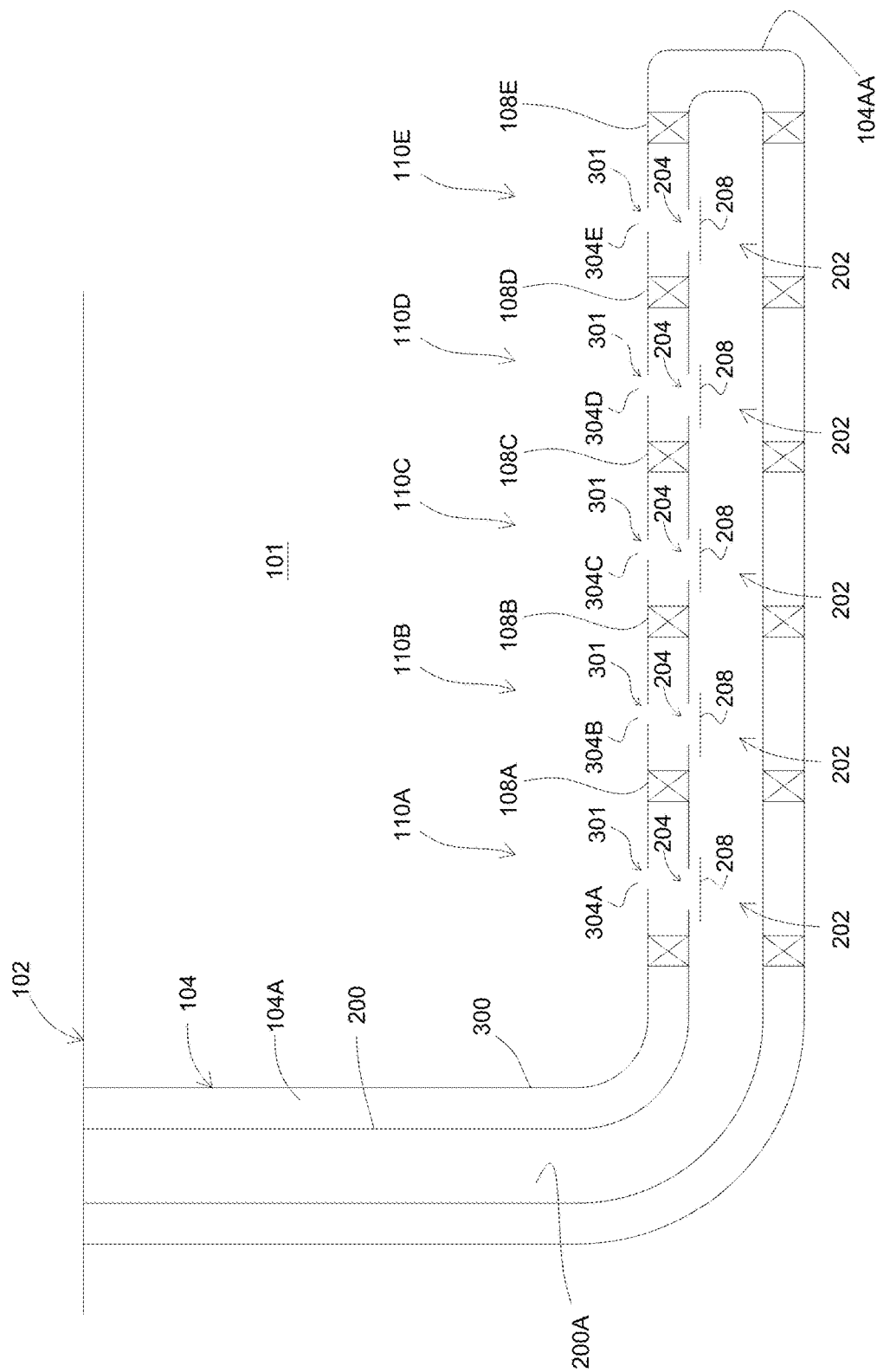
FIG. 2 is a schematic diagram of an injection string of the apparatus of FIG. 1 in accordance with an example embodiment of the present disclosure.

Referring to FIG. 2, the injection of the injection fluid from the surface 102 to the subterranean formation 101, via the injection well 104, is effected via one or more flow communication stations (five (5) flow communications 110A-E are illustrated). Successive flow communication stations may be spaced from each other along the wellbore such that each one of the flow communication stations 110A-E, independently, is positioned adjacent a zone or interval of the subterranean formation 101 for effecting flow communication between the wellbore 104A and the zone (or interval).

The injection fluid is injected through the wellbore 104A of the injection well 104 via an injection conduit 200, such as an injection string including an injection string passage 200A. The injection string 200 is disposed within the injection well 104. The injection fluid is injected from the injection string 200 into the wellbore 104A.

For effecting the flow communication between the injection string 200 and the wellbore 104A, at each one of the flow communication stations 110A-E, independently, the injection string 200 includes a respective flow control apparatus (valve) 202. The valve 202 includes a flow communicator 204 through which the injection of the injection fluid, into the wellbore, is effectible. The valve 202 is configured for integration within the injection string 200. The integration may be effected, for example, by way of threading or welding.

The valve 202 includes a flow control member 208. The flow control member 208 is configured for controlling the conducting of material by the valve 202 via the injection string flow communicator 204. The flow control member 208 is displaceable relative to the injection string flow communicator 204 for effecting opening of the injection string flow communicator 204. In some embodiments, for example, the flow control member 208 is also displaceable, relative to the injection string flow communicator 204, for effecting closing of the injection string flow communicator 204. In this respect, the flow control member 208 is displaceable from a closed position to an open position. The open position corresponds to an open condition of the injection string flow communicator 204. The closed position corresponds to a closed condition of the injection string flow communicator 204. For each one of the flow communication stations 110A-E, independently, an open condition of the flow communication station corresponds to the open condition of the respective injection string flow communicator 204. For each one of the flow communication stations 110A-E, independently, a closed condition of the flow communication station corresponds to the closed condition of the respective injection string flow communicator 204

In the closed position, the injection string flow communicator 204 is covered by the flow control member 208, and the displacement of the flow control member 208 to the open position effects at least a partial uncovering of the flow communicator 204 such that the flow communicator 204 becomes disposed in the open condition. In some embodiments, for example, in the closed position, the flow control member 208 is disposed, relative to the injection string flow communicator 204, such that a sealed interface is disposed between the injection string passage 200A and the wellbore 104A, and the disposition of the sealed interface is such that the conduction of the injection fluid between the injection string passage 200A and the wellbore 104A, via the injection string flow communicator 204 is prevented, or substantially prevented, and displacement of the flow control member 208 to the open position effects flow communication, via the injection string flow communicator 204, between the injection string passage 200A and the subterranean formation 101, such that the conducting of the injection fluid from the injection string passage 200A and the wellbore 104A, via the injection string flow communicator 204, is enabled.

In some embodiments, for example, the flow control member 208 is displaceable by a shifting tool. In some embodiments, for example, the flow control member is displaceable in response to receiving of an actuation signal (such as, for example, by actuation by a hydraulic pump).

In some embodiments, for example, the injection well 104 includes a cased-hole completion. In such embodiments, the wellbore 104A is lined with casing 300.

A cased-hole completion involves running casing 300 down into the wellbore 104A through the production zone. The casing 300 at least contributes to the stabilization of the subterranean formation 101 after the wellbore 104A has been completed, by at least contributing to the prevention of the collapse of the subterranean formation 101 that is defining the wellbore 101. In some embodiments, for example, the casing 300 includes one or more successively deployed concentric casing strings, each one of which is positioned within the wellbore 104A, having one end extending from the wellhead 12. In this respect, the casing strings are typically run back up to the surface. In some embodiments, for example, each casing string includes a plurality of jointed segments of pipe. The jointed segments of pipe typically have threaded connections.

In some embodiments, for example, it is desirable to seal an annulus, formed within the wellbore, between the casing string and the subterranean formation. Sealing of the annulus is desirable for mitigating versus conduction of the fluid, being injected into the subterranean formation, into remote zones of the subterranean formation and thereby providing greater assurance that the injected fluid is directed to the intended zone of the subterranean formation.

To prevent, or at least interfere, with conduction of the injected fluid through the annulus, and, perhaps, to an unintended zone of the subterranean formation that is desired to be isolated from the formation fluid, or, perhaps, to the surface, the annulus is filled with a zonal isolation material. In some embodiments, for example, the zonal isolation material includes cement, and, in such cases, during installation of the assembly within the wellbore, the casing string is cemented to the subterranean formation 101, and the resulting system is referred to as a cemented completion.

In some embodiments, for example, the zonal isolation material is disposed as a sheath within an annular region between the casing 300 and the subterranean formation 101. In some embodiments, for example, the zonal isolation material is bonded to both of the casing 300 and the subterranean formation 101. In some embodiments, for example, the zonal isolation material also provides one or more of the following functions: (a) strengthens and reinforces the structural integrity of the wellbore, (b) prevents, or substantially prevents, produced formation fluids of one zone from being diluted by water from other zones, (c) mitigates corrosion of the casing 300, and (d) at least contributes to the support of the casing 300.

In those embodiments where the injection well 104 includes a cased completion, in some of these embodiments, for example, the casing includes the plurality of casing flow communicators 304A-E, and for each one of the flow communication stations 110A-E, independently, the flow communication between the wellbore 104A and the subterranean formation 101, for effecting the injection of the injection fluid, is effected through the respective one of the casing flow communicators 304A-E. In some embodiments, for example, each one of the casing flow communicators 304A-E, independently, is defined by one or more openings 301. In some embodiments, for example, the openings are defined by one or more ports that are disposed within a sub that has been integrated within the casing string 300, and are pre-existing, in that the ports exist before the sub, along with the casing string 300, has been installed downhole within the wellbore 104A. Referring to FIG. 2, in some embodiments, for example, the openings are defined by perforations 301 within the casing string 300, and the perforations are created after the casing string 300 has been installed within the wellbore 104A, such as by a perforating gun. In some embodiments, for example, for each one of the flow communication stations 110A-E, independently, the respective one of the casing flow communicator 304A-E is disposed in alignment, or substantial alignment, with the injection string flow communicator 204 of the respective one of the flow communication stations 110A-E In this respect, in those embodiments where the injection well 104 includes a cased completion, in some of these embodiments, for example, for each one of the flow communication stations 110A-E, independently, flow communication, via the flow communication station, is effectible between the surface 102 and the subterranean formation 101 via the injection string 104, the respective injection string flow communicator 204, the annular space 104B within the wellbore 104A between the injection string 200 and the casing string 300, and the respective one of the casing string flow communicators 304A-E.

In some embodiments, for example, while injecting injection fluid into the subterranean formation 101 via a one of the flow communication stations 110A-E (the stimulation-effecting flow communication station), for each one of the adjacent flow communication stations, independently, a sealed interface is disposed within the wellbore 104A-E for preventing, or substantially preventing, flow communication, via the wellbore, between the stimulation-effecting flow communication station and the adjacent flow communication station. In this respect, with respect to the embodiment illustrated in FIG. 1, sealed interfaces 108A-D are provided. In some embodiments, for example, the sealed interface is established by a packer. In those embodiments where the completion is a cased completion, in some of these embodiments, for example, the sealed interface extends across the annular space between the injection string 200 and the casing string 300.

In some embodiments, for example, with respect to the flow communication station that is disposed furthest downhole (i.e. flow communication station 110E), a further sealed interface 108E is disposed within the wellbore 104A for preventing, or substantially preventing, flow communication between the flow communication station 110E and a downhole-disposed portion 104AA of the wellbore 104A.

Figure 3:
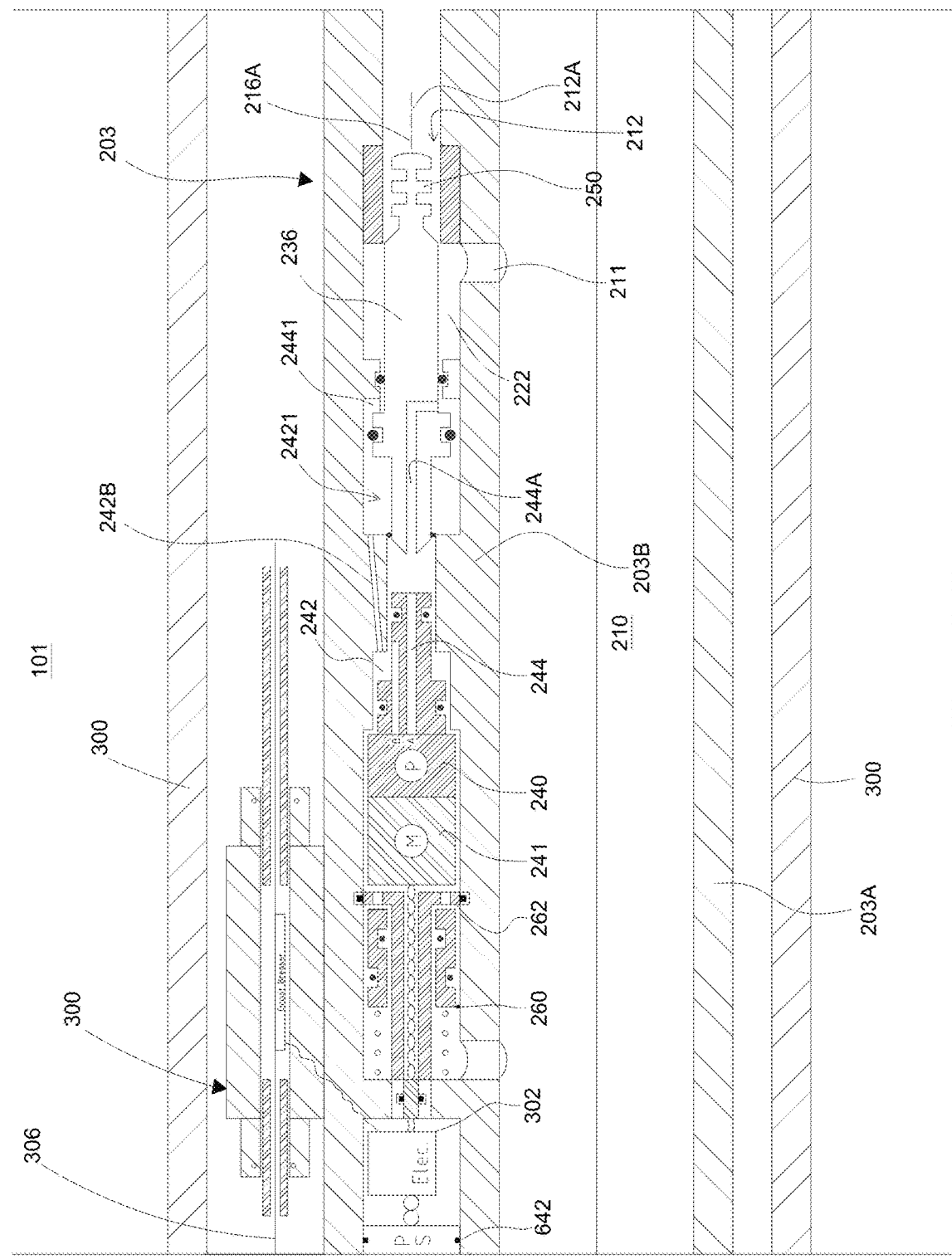
FIG. 3 is a schematic diagram of a valve for use in the injection string of FIG. 2 with the valve in a closed condition in accordance with an example embodiment of the present disclosure.

Referring to FIGS. 2 and 3, in some embodiments, for example, the valve 202 includes a housing 203. The housing 203 contains a fluid conductor 205 and a valve subassembly 230. The fluid conductor 205 includes a fluid passage housing 203A that defines a fluid passage 210 for effecting conduction of the injection fluid through the valve 202 while the valve 202 is integrated within the injection string 200. In this respect, the fluid passage 210 forms part of the injection string passage 200A.

The valve subassembly 230 is provided for controlling flow communication between the fluid passage 210 and the subterranean formation 101. In this respect, the valve subassembly 230 includes a valve subassembly housing 203B that contains the flow communicator 204 and the flow control member 208. The housing 203B is mounted to the housing 203A.

The flow communicator 204 effects flow communication between the fluid passage 210 and the subterranean formation 101. The flow communicator 204 includes one or more ports 212 defined within an outermost surface of the housing 203 (such as, for example, a manifold of the housing 203B). In this respect, the flow communication between the fluid passage 210 and the subterranean formation 101 is effectible via the one or more ports 212. The injection string flow communicator 204 further includes an orifice 216 disposed within a space 222 (e.g. a passage) between the fluid passage 210 and the one or more ports 212, such that flow communication between the fluid passage 210 and the one or more ports 212 (and, therefore, the subterranean formation 101) is effectible via the orifice 216.

Figure 4:
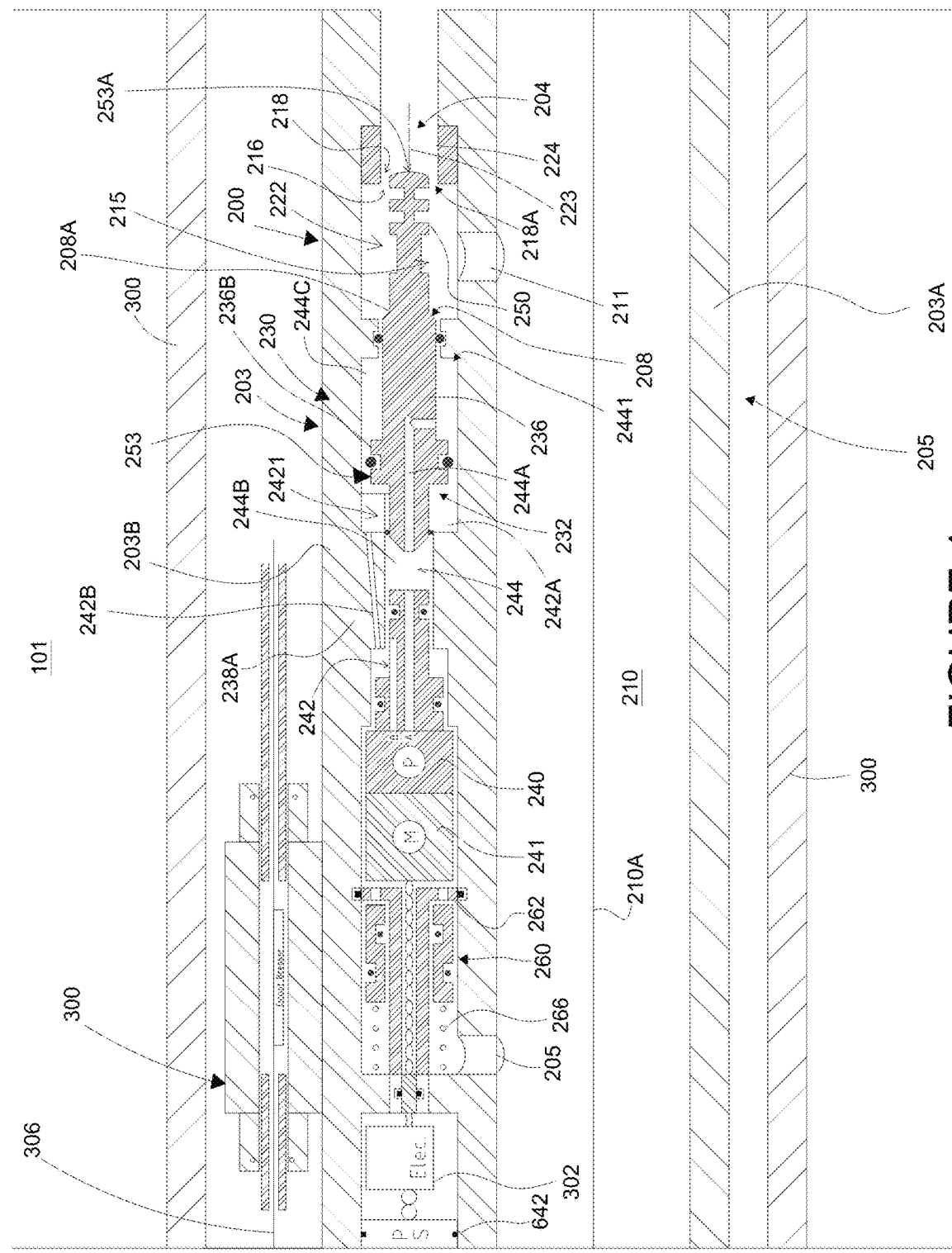
FIG. 4 is a schematic diagram of a valve for use in the injection string of FIG. 2 with the flow communicator in an open condition in accordance with an example embodiment of the present disclosure.

The orifice 216 is defined within a valve seat 218. In some embodiments, for example, the valve seat 218 is defined within a manifold of the housing 203B. The valve seat 218 is configured for receiving seating of the flow control member 208 (such that the flow control member 208 becomes disposed in the closed position) for effecting disposition of the injection string flow communicator 204 in the closed condition. Referring to FIG. 4, while the flow control member 208 is spaced apart from the valve seat 218, the flow control member 208 is disposed in the open position, and, correspondingly, flow communication is established between the fluid passage 210 and the one or more ports 212 via the orifice 216, such that the injection string flow communicator 204 is disposed in the open condition. In some embodiments, for example, the flow control member 208 includes a seat-engaging surface 208A for seating on a seating surface 218A defined by the valve seat 218 (FIG. 3), such that the flow communicator 204 becomes disposed in the closed condition. In some embodiments, for example, the material of the seat engaging surface 208A is nickel aluminum bronze and the material of the seating surface 218A is QPQ-nitrided 17-4PH stainless steel.

The orifice 216 has a central axis 216A, and the fluid passage 210 defines a central longitudinal axis 210A. In some embodiments, for example, the orifice 216 and the fluid passage 210 are co-operatively configured such that, while the valve 202 is oriented such that the central axis 216A is disposed within a horizontal plane, the central longitudinal axis 210A is disposed at an acute angle of less than 45 degrees relative to the horizontal plane, such as, for example, at an acute angle of less than 22.5 degrees relative to the horizontal plane, such as, for example at an acute angle of less than 10 degrees relative to the horizontal plane. In some embodiments, for example, the orifice 216 and the fluid passage 210 are co-operatively configured such that, while the valve 202 is oriented such that the central axis 216A is disposed within a horizontal plane, the central longitudinal axis 210A is parallel, or substantially parallel, to the horizontal plane.

In some embodiments, for example, the orifice 216 defines a central axis 216A, and each one of the one or more ports 212, independently, define a central axis 212A. In some embodiments, for example, the orifice 216 and the one or more ports 212 are co-operatively configured such that, while the valve 202 is oriented such that the central axis 216A is disposed within a horizontal plane, the central axis 212A is disposed at an acute angle of less than 45 degrees relative to the horizontal plane, such as, for example, at an acute angle of less than 22.5 degrees relative to the horizontal plane, such as, for example at an acute angle of greater than 10 degrees relative to the horizontal plane. In some embodiments, for example, the orifice 216 and the one or more ports 212 are co-operatively configured such that, while the valve 202 is oriented such that the central axis 216A is disposed within a horizontal plane, the central axis 212A is parallel to the horizontal plane.

In some embodiments, for example, a tracer material source 224 is disposed within the space 222. The tracer material source 224 is configured for releasing tracer material into injection fluid that is flowing past the tracer material source 224, while being injected into the subterranean formation 101 via the injection string flow communicator 204, for monitoring by a sensor within the system 100 to provide information about the process. By virtue of the above-described co-operative orientation of the fluid passage 210, the orifice 216, and the one or more of the ports 212, there is an opportunity to increase the volume of the space 222 disposed between the fluid passage 210 and the one or more ports 212 without impacting, or without at least significantly impacting, on the space available within the apparatus 210 for defining the fluid passage 210. In this respect, the space 222 could be made larger for accommodating a larger quantity of tracer material.

In some embodiments, for example, the valve subassembly 230 further includes an actuator 232 for effecting displacement of the flow control member 208 relative to the valve seat 218. In some embodiments, for example, the flow control member 208 is mounted to the actuator 232.

In some embodiments, for example, the actuator 232 is a linear actuator, and is disposed for movement along a linear axis, such that the flow control member 208, correspondingly, is also disposed for movement along the linear axis. In some embodiments, for example, this axis of travel is parallel, or substantially parallel, to the central axis of the orifice 116 (and, in some embodiments, for example, the travel is along an axis that is co-incident, or substantially co-incident, with the central axis 216A of the orifice 116).

In some embodiments, for example, seating of the flow control member 208 relative to the valve seat 218 (FIG. 3) is effected by extension of the linear actuator 232 towards the valve seat 218 to an extended position, and unseating of the flow control member 208 relative to the valve seat 218 is effected by retraction of the linear actuator 232 relative to the valve seat 218 to a retracted position. In some embodiments, for example, the linear actuator 232 is configured to reciprocate between the extended (FIG. 3) and retracted positions (FIG. 4).

In some embodiments, for example, the linear actuator 232 is a hydraulic actuator that includes working fluid and a piston 236, with the working fluid being disposed in fluid pressure communication with the piston 236. In some embodiments, for example, the working fluid is a hydraulic oil. Relatedly, the valve sub-assembly housing 203B is configured for containing the working fluid. The housing 203B, the working fluid, and the piston 236 are co-operatively configured such that, in response to pressurizing of the working fluid 236, an unbalanced force is established and exerted on the piston 236 for urging movement of the piston 236, with effect that the flow control member 208 is displaced relative to the valve seat 218. In some embodiments, for example, the hydraulic actuator 232 has a first mode of operation and a second mode of operation, and, in the first mode of operation, the establishment of an unbalanced force is with effect that seating of the flow control member 208, relative to the valve seat 218, is effected (FIG. 3), and, in the second mode of operation, the establishment of an unbalanced force is with effect that unseating of the flow control member 208, relative to the valve seat 218, is effected (FIG. 4). In some embodiments, for example, the hydraulic actuator 232 further includes a bi-directional pump 240 which is operable in the first and second modes of operation in co-operation with a bi-directional motor 241 that is electrically coupled, via a eight (8) pin connector 302, to a power supply, extending externally, of the injection string 200, in the form of a power and communications cable 306. The valve 202 also comprises a pressure sensor 642 coupled to a PLC 606 (FIG. 6) at the surface 102 via the power and communications cable 306. Alternatively, the pressure sensor 642 may be coupled to the PLC 606 wirelessly via a wireless transmitter (not shown) of the valve 202.

In those embodiments where the hydraulic actuator 232 includes a bi-directional pump 240, in some of these embodiments, for example, a first working fluid-containing space 242 and a second working fluid-containing space 244 are disposed within the housing 203B. Each one of the spaces 242, 244, independently, is disposed in fluid pressure communication with the piston 236.

The housing 203B, the bidirectional pump 240, the first space 242, and the second space 244 are co-operatively configured such that, while the flow control member 208 is seated relative to the valve seat 218, and the bidirectional pump 240 becomes disposed in the first mode of operation, the bidirectional pump 240 is receiving supply of working fluid from the first space 242 and discharging pressurized working fluid into the second space 244, with effect that working fluid, within the second space 244, and in fluid pressure communication with the piston 236, becomes disposed at a higher pressure than working fluid within the first space 242 and in fluid pressure communication with the piston 236, such that an unbalanced force is acting on the piston 236 and effects retraction of the piston 236 relative to the valve seat 218, such that the flow control member 208 becomes unseated relative to the valve seat 218 and thereby effecting flow communication between the fluid passage 210 and the subterranean formation via the flow communicator 204.

The housing 203B, the bidirectional pump 240, the first space 242, and the second space 244 are further co-operatively configured such that, while the flow control member 208 is unseated relative to the valve seat 218, and the bidirectional pump 240 becomes disposed in the second mode of operation, the bidirectional pump 240 is receiving supply of working fluid from the second space 244 and discharging pressurized working fluid into the first space 242, with effect that working fluid, within the first space 242 and in fluid pressure communication with the piston 236, becomes disposed at a higher pressure than working fluid within the second space and in fluid pressure communication with the piston, such that an unbalanced force is acting on the piston 236 and effects extension of the piston 236 relative to the valve seat 218, such that the flow control member 208 becomes seated relative to the valve seat 218, with effect that the flow communicator 204 becomes disposed in the closed condition.

In some embodiments, for example, the first space 242 is disposed for fluid coupling with a working fluid supply compensator 260, in response to the pressure of the working fluid within the first space 242 becoming disposed below a minimum predetermined pressure. Similarly, in some embodiments, for example, the second space 244 is disposed for fluid coupling with a working fluid supply compensator 260, in response to the pressure of the working fluid within the second space 244 becoming disposed below a minimum predetermined pressure. This is to ensure that working fluid is being supplied from the discharge of the pump 240 at a sufficient pressure for acting on the piston 236 and overcoming the force applied by the injection fluid within the space 222 for resisting movement of the piston 236, and thereby effecting extension and retraction of the piston 236.

The working fluid supply compensator 260 includes working fluid disposed at a pressure of at least the pressure of the injection fluid disposed within the fluid passage 210. In this respect, the working fluid within the working fluid supply compensator 260 is disposed in fluid pressure communication with the injection fluid disposed within the fluid passage 210, such as via a moveable piston 262 that is sealingly disposed within the working fluid supply compensator 260. In some embodiments, for example, the pressure of the injection fluid disposed within the fluid passage 210 is between 0 psig and 10,000 psig.

The injection fluid is communicated from the fluid passage 210 via a port 205 disposed within the housing 203A, such that the working fluid within the working fluid supply compensator 260 is disposed at the same, or substantially the same, pressure as the injection fluid within the fluid passage 210. In some embodiments, for example, a resilient member, such as spring 266, is disposed within the compensator 260 and biases the piston 262 towards the working fluid for creating a pre-load on the working fluid, and this is useful during start-up to prevent cavitation. In this respect, the pressure of the working fluid is equivalent to about the sum of the pressure of the injection fluid within the fluid passage 210 and that attributable to the spring force.

Figure 5:
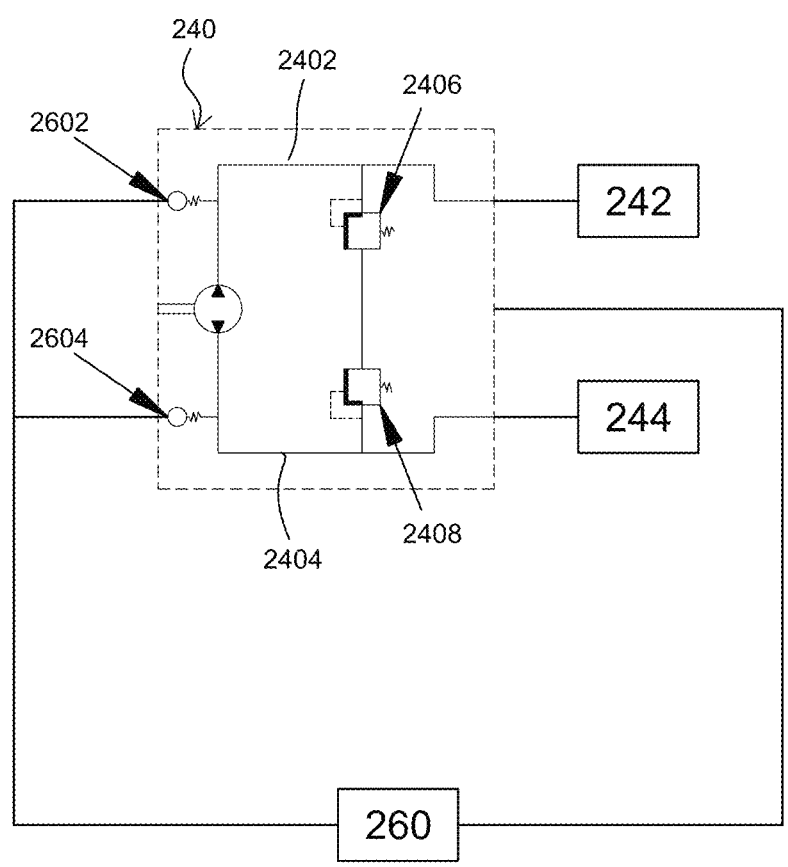
FIG. 5 is a schematic diagram of the valve of FIGS. 2 and 3 showing the flow communication between a bi-directional pump, first and second working fluid-containing spaces, and a working fluid supply compensator of the valve in accordance with an example embodiment of the present disclosure.

Referring to FIG. 5, a one-way valve 2602 (such as, for example, a check valve) is provided for controlling flow communication with the working fluid supply compensator 260, and is configured for opening in response to the pressure of the working fluid within the first space 242 becoming disposed below the pressure of the working fluid within the working fluid compensator 260. Similarly, a one-way valve 2604 (such as, for example, a check valve) is provided for controlling flow communication with the working fluid supply compensator 260, and is configured for opening in response to the pressure of the working fluid within the second space 244 becoming disposed below the pressure of the working fluid within the working fluid compensator 260.

Again referring to FIG. 5, the bi-directional hydraulic pump 240 includes a first fluid passage 2402 that is disposed in flow communication with the first space 242, and a second fluid passage 2404 that is disposed in flow communication with the second space 244. The first fluid passage 2402 is disposed in flow communication with a valve 2406 (such as, for example, a relief valve) configured for opening in response to the pressure differential between the first fluid passage 2402 and the working fluid supply compensator 260 becoming disposed above a predetermined maximum pressure differential (such as, for example, 5500 psig), with effect that working fluid from within the first space 242 is conducted to the working fluid supply communicator 260 for accumulation within the working fluid supply communicator 260. Similarly, the second fluid passage 2404 is disposed in flow communication with a valve 2408 (such as, for example, a relief valve) configured for opening in response to the pressure differential between the second fluid passage 2404 and the working fluid supply communicator 260 becoming disposed above a predetermined maximum pressure differential (such as, for example, 5500 psig), with effect that working fluid from within the second space 242 is conducted to the working fluid supply communicator 260 for accumulation within the working fluid supply communicator 260. By virtue of this configuration, fluid pressure within the first and second spaces 242, 244 may be sufficiently reduced for establishing the necessary force imbalance to effect actuation of the piston 236.

Referring again to FIGS. 2 and 3, in some embodiments, for example, a passage 244A extends through the piston 236 and joins two portions 244B, 244C of the space 244. In this respect, the piston 236, the space 244B, and the space 244C are co-operatively configured such that joinder of the spaces 244B, 244C is maintained while the piston 236 is displaced between the extended and retracted positions. By configuring the second space 244 in this manner, fluid communication between the space 242 and the hydraulic pump 240 is effected on the same side of the hydraulic pump 240 as is fluid communication between the space 244 and the hydraulic pump 240. In this respect, space within the housing 203, occupied by the first and second spaces 242, 244, is minimized, thereby enabling more of the space within the housing 203 to be dedicated for the fluid passage 210.

In some embodiments, for example, the space 244C is defined by a chamber 2441 that is disposed within the housing 203B, between an enlarged piston portion 236B of the piston 236 and the orifice 218. Relatedly, a portion 242A of the first space 242 is defined by a chamber 2421 that is disposed within the housing 203B and is also disposed, relative to the chamber 2441, on an opposite side of the enlarged piston portion 236B, between the enlarged piston portion 236B and a union 238A. Working fluid within chamber 2441 is urging displacement of the enlarged piston portion 236B remotely relative to the orifice 216, and thereby urging the flow control member 108 towards an unseated position. Working fluid within chamber 2421 is urging displacement of the enlarged piston portion 236B towards the orifice 216, and thereby urging the flow control member 108 towards a seated position.

Displacement of the enlarged piston portion 236B, remotely relative to the orifice 216, is limited by the union 238A, which, in this respect, functions as a piston retraction-limiting stop. Relatedly, displacement of the enlarged piston portion 236B, towards the orifice, is limited by the valve seat 218. In some embodiments, for example, while being displaced during the retraction and extension of the piston 236, the enlarged piston portion 236B is sealingly disposed within the housing 203B, thereby preventing, or substantially preventing, conduction of working fluid between the chambers 2421 and 2441 via space between the housing 203B and the enlarged piston portion 236B.

The union 238A forms part of the housing 203B. The union 238A is disposed between the hydraulic pump 240 and the chamber 2421 (and, therefore, also the chamber 2441). In some embodiments, for example, the hydraulic pump 240 is threadably coupled to the union 238A.

A passage 242B extends through the union 238A such that the space 242 extends from the space 242A defined by the chamber 2421 to the hydraulic pump 240, via the passage 242B.

In some embodiments, for example, a cutting tool 250 is mounted to the piston 236 for translation with the flow control member 208 while the flow control member 208 is being displaced between the seated and the unseated positions. The flow control member 208 and the cutting tool 250 are co-operatively configured such that, while the flow control member 208 is seated relative to the valve seat 218, the cutting tool 250 extends into a space 223 disposed between the orifice 216 and the one or more ports 212. In some embodiments, for example, the flow control member 208 and the cutting tool 250 are also co-operatively configured such that, while the flow control member 208 is unseated relative to the valve seat 218, at least a portion of the cutting tool 250 is retracted from the space 223.

In some embodiments, for example, the flow control member 208, the valve seat 218, the orifice, the space 223 extending from the orifice 216 to the one or more ports, and the cutting tool are co-operatively configured such that, while the flow control member 208 is unseated relative to the valve seat 218, and the cutting tool 250 is disposed within the space 223 (e.g. a passage), the cutting tool 250 occupies less than about 70% of the cross-sectional area of the space 223, such as, for example, less than about 60% of cross-sectional area of the space 223.

The flow control member 208 and the cutting tool 250 are further co-operatively configured such that, while: (i) the flow control member 208 is being displaced relative to the valve seat 218 between the seated and the unseated positions, and (ii) solid debris is disposed within the space 223 (such as, for example, by way of ingress from the subterranean formation 101 via the one or more ports 202, or, such as, for example, by way of precipitation from the injection fluid, or both), the cutting tool 250 effects size reduction of the solid debris (such as, for example, by way of comminution, such as, for example, by way of crushing, grinding, or cutting), such that size-reduced solid debris is obtained. By effecting such size reduction, obstruction of flow communication between the fluid passage 210 and the injection string flow communicator 204 is mitigated. As well, by effecting such size reduction, obstruction of mechanical components of the valve apparatus 202, by such solid debris, is mitigated.

In some embodiments, for example, the flow control member 208 and the cutting tool 250 are further co-operatively configured such that, while the flow control member 208 is being retracted relative to the valve seat 218 (i.e. from the seated position), the size-reduced solid debris is urged into the fluid passage 210 via a port 211, that is fluidly coupled to the orifice 216 with a fluid passage 215, defined within the housing 203B, such that the port 211 effects flow communication between the fluid passage 210 and the orifice 216. In some embodiments, for example, the urging is effected by the cutting tool 250 as the piston 236 is being retracted. In this respect, in some embodiments, for example, the flow control member 208, the cutting tool 250 and the port 211 are co-operatively configured such that, while the flow control member 208 is being retracted relative to the valve seat 218 (i.e. from the seated position), the port 211 is disposed to receive the size-reduced solid debris being urged from the space 223 by the cutting tool 250 (for conduction into the fluid passage 210) that is translating with the flow control member 208.

In some embodiments, for example, the cutting tool 250 includes a plurality of cutting blades extending outwardly from an outer surface. In some embodiments, the distance by which the blades extend outwardly from the outer surface is at least $30/1000$ of an inch. In some embodiments, for example, the cutting tool 250 includes grooves disposed between the cutting blades. In some embodiments, for example, a set of the cutting blades is arranged along a spiral path. In some embodiments, for example, the cutting tool 250 includes a reamer.

In some embodiments, for example, a reciprocating assembly 253 includes at least the piston 236 and the flow control member 208, and, in some embodiments, further includes the cutting tool 250. While the flow control member 208 is seated relative to the valve seat 218, a distal end 253A, of the reciprocating assembly 253, extends through the orifice 216 and into the space 223, while being spaced apart from the housing 203B. While spaced apart from the housing 203, the distal end 253A is susceptible to deflection from the weight of solid debris which may have accumulated within the space 223. To mitigate versus undesirable deflection, while the flow control member 208 is seated relative to the valve seat 218, the maximum spacing distance, between the distal end 253A and the housing 203B is less than $30/1000$ of an inch. In some embodiments, for example, while the flow control member 208 is seated relative to the valve seat 218, the distal end 253A is disposed within the space 223 (e.g. a passage) that is extending from the orifice 216 to the one or more ports 212.

Although the valve 202 has been described above as being configured for integration within an injection string, the valve 202 may be configured for integration within a production string and used within a production string, which may be in a different well as an offsetting injection string or the same well as an injection string, each of the injection strings and/or production strings comprising a number of valves 202.

Figure 9:
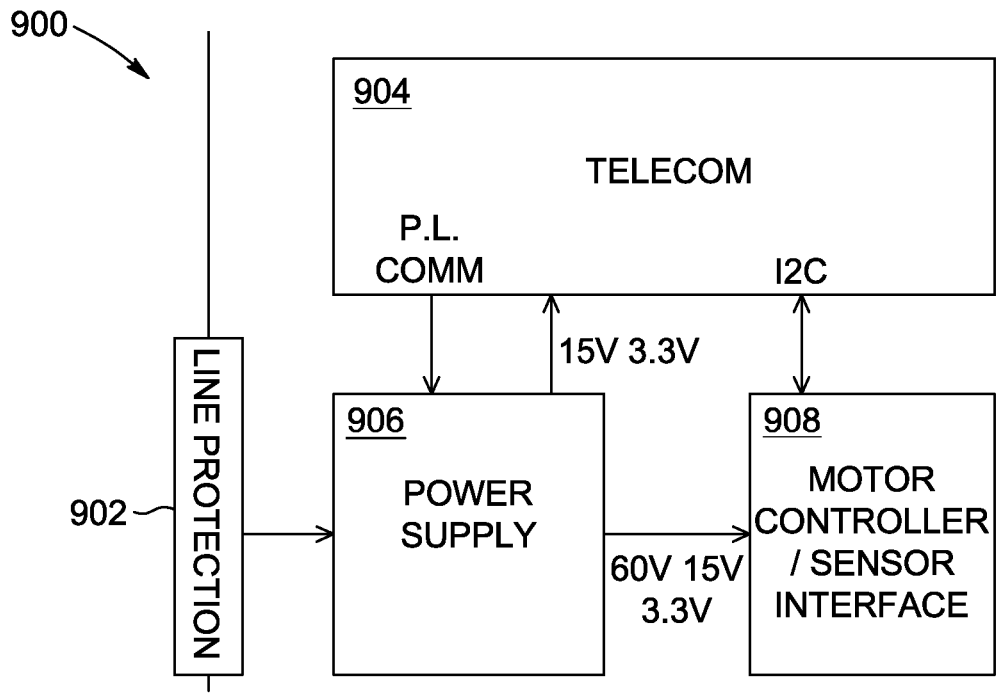
FIG. 9 is a block diagram of a control unit of a flow communication station in accordance with one example embodiment of the present disclosure.

Method of Fault Detection and Recovery in a Tubing String Located in a Hydrocarbon Well and Method of Fault Protection in a Tubing String Located in a Hydrocarbon FIG. 9 is a block diagram of a control unit 900 for a flow communication station in accordance with one example embodiment of the present disclosure. The control unit 900 comprises a line protection circuit 902 in a shared data and power cable 901, which in at least some examples is a power-line providing both data and communications via power-line commutations (PLC), a telecommunications unit 904 for communication with control equipment on the surface 102, a power supply 906 for powering the control unit 900, and a motor controller and sensor interface 908 for controlling the flow communication station and sensors of the flow communication station. In some examples, sensors 904, 952 (FIG. 10) and a motor 960 (FIG. 10) are connected via connector rather than wire-to-board, although wire-to-board could be used in alternative embodiments.

In some examples, the motor controller and sensor interface 908 may be a combination of hardware and software as well as the pressure sensor circuits. In one example, the power supply 906 is a 100-300 Vdc to 60V, 15V and 3.3V, 30 W design. The power supply 906 includes a planar transformer.

Figure 10:
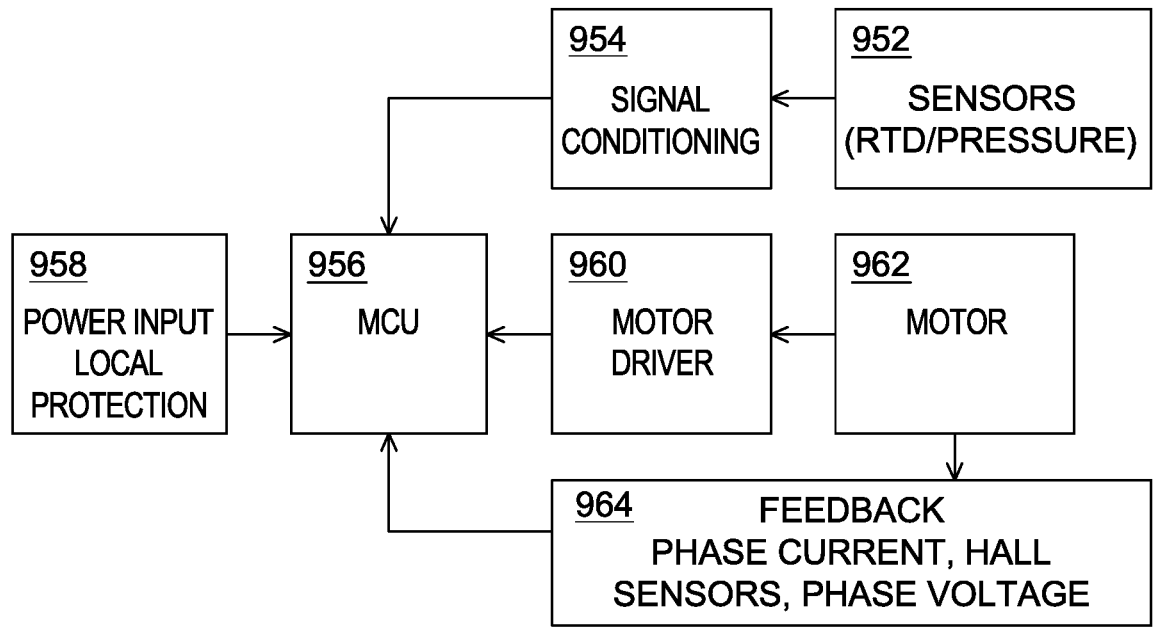
FIG. 10 is a block diagram showing a motor controller and sensor interface of the control unit of FIG. 9 in accordance with one example embodiment of the present disclosure.

FIG. 10 is a block diagram of the motor controller and sensor interface 908 of FIG. 9. Sensors 952, including pressure sensors and resistance temperature detectors (RTD), sense pressure and temperature at the flow communication station and output the sensed data to a signal conditioner 954, which processes the sensed data before output to a microcontroller (MCU) 954. The MCU 956 is connected to and powered by the power supply 306 which provides a local protection power input 958. The MCU 956 interfaces with a motor driver 960 which drives a motor 962 controlling the valve 202. The MCU 954 includes a digital communication interface and is externally programmable via the telecommunications unit 904 (e.g. telecommunications board). The motor control is bidirectional and allows output current sensing, torque control, detection of stall conditions and position sensing/memory. Sensor/sensorless control may also be provided.

Figure 11:
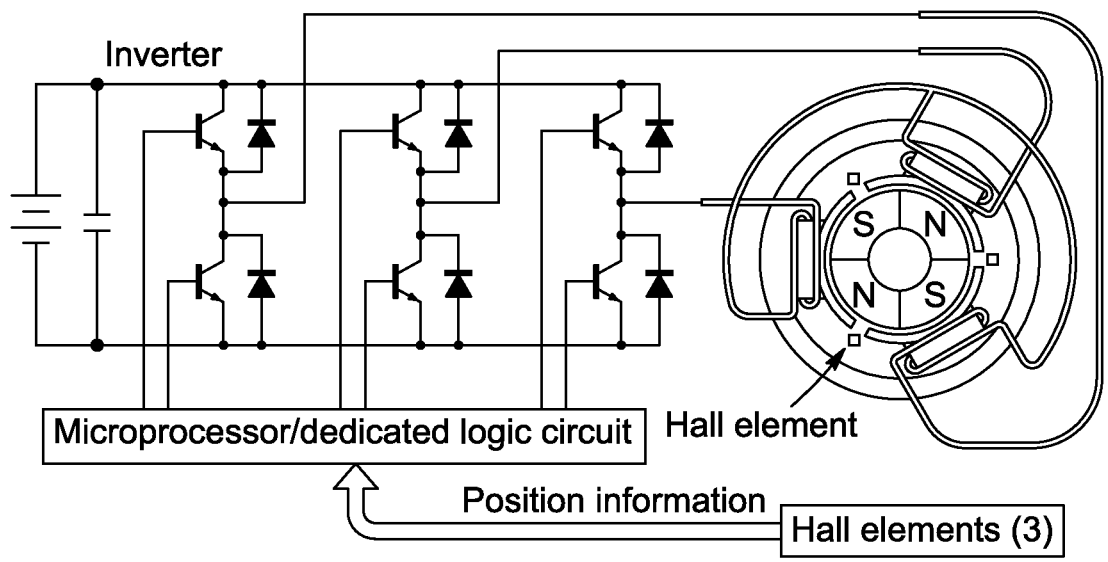
FIG. 11 is a schematic diagram showing a driver circuit of the motor controller and sensor interface of FIG. 10.
Figure 12:
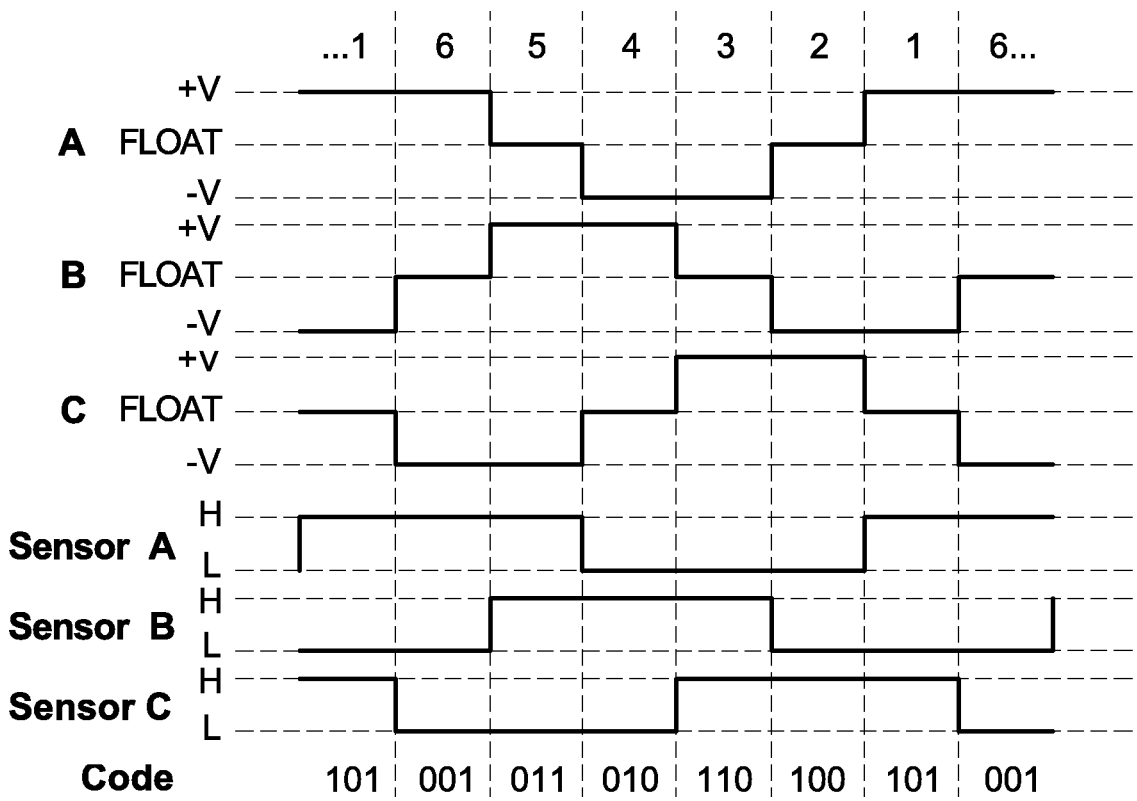
FIG. 12 is a switching diagram for the driver circuit of FIG. 11.
Figure 13:
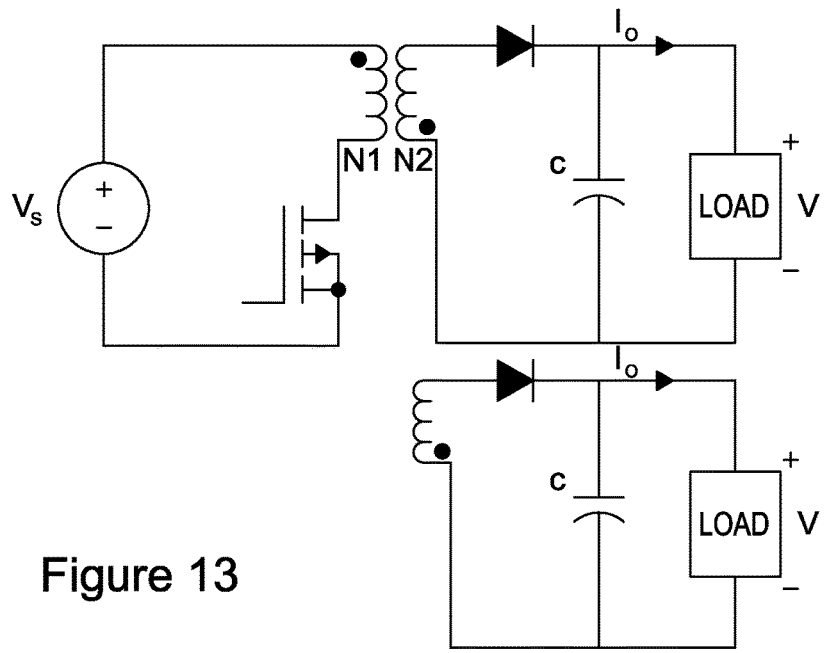
FIG. 13 is a general circuit diagram showing the topography of the power supply of the control unit of FIG. 9.

Feedback 964 from the motor 960, such as phase current, hall sensors, and phase voltage, are provided to the MU 956. FIG. 11 illustrates a driver circuit of the motor driver 960 in accordance with one embodiment of the present disclosure. FIG. 12 illustrates a switching diagram for the driver circuit of FIG. 11. FIG. 13 is a general circuit diagram showing the topography of the power supply of the control unit 900 of FIG. 9.

For the telemetry system of the flow communication station, data is coupled to the power conductor using a small isolation transformer and coupling capacitor. This allows a single conductor to be used in the power-line and the casing as a return. It is a half-duplex system in which only one control unit of a valve 202 can transmit at a time so that a surface modem controls which control unit is transmitting and when that control unit is transmitting. Each control unit has a unique address so that a relative position of the control unit in the well is known. In some examples, data modulation is performed by binary phase-shift keying (BPSK), a form of differential phase-shift keying (DPSK) with an option to be Quadrature phase-shift keying (QPSK) or 8-psk depending on data requirements. Pulse Width Modulation (PWM) outputs from a processor of the controller are output into a half bridge driver that drives a transformer (the coupling network) to shape and couple the data to the power-line. The half bridge driver is similar to a class D audio amplifier. The data communication may be a serial communications protocol such as Modbus or a derivation thereof.

Within an injection wellbore 104A, a shared line is used to provide data and power to control units 900 for the flow communication station 110. Each control unit 900 is connected in series for both data and power. Conventionally, when a short circuit (e.g., output short circuit) occurs in the line, or a control unit fault or failure occurs, the injection string ceases to return any data from downhole, effectively causing the injection well 104 to become inoperable. Examples of control unit faults and/or failures include over-voltage and under-voltage. When a short circuit, control unit fault or failure occurs, data for the injection well 104 will not be returned to the control system on the surface 102 from the injection string, and the line will have a low voltage even at high currents. As a result, the injection well 104 is not operational. To restore operation to the valve affected by the short circuit, fault or failure, the injection string must typically be removed from the injection well 104 for inspection and repair of the short circuit, control unit fault or control unit failure.

Figure 14:
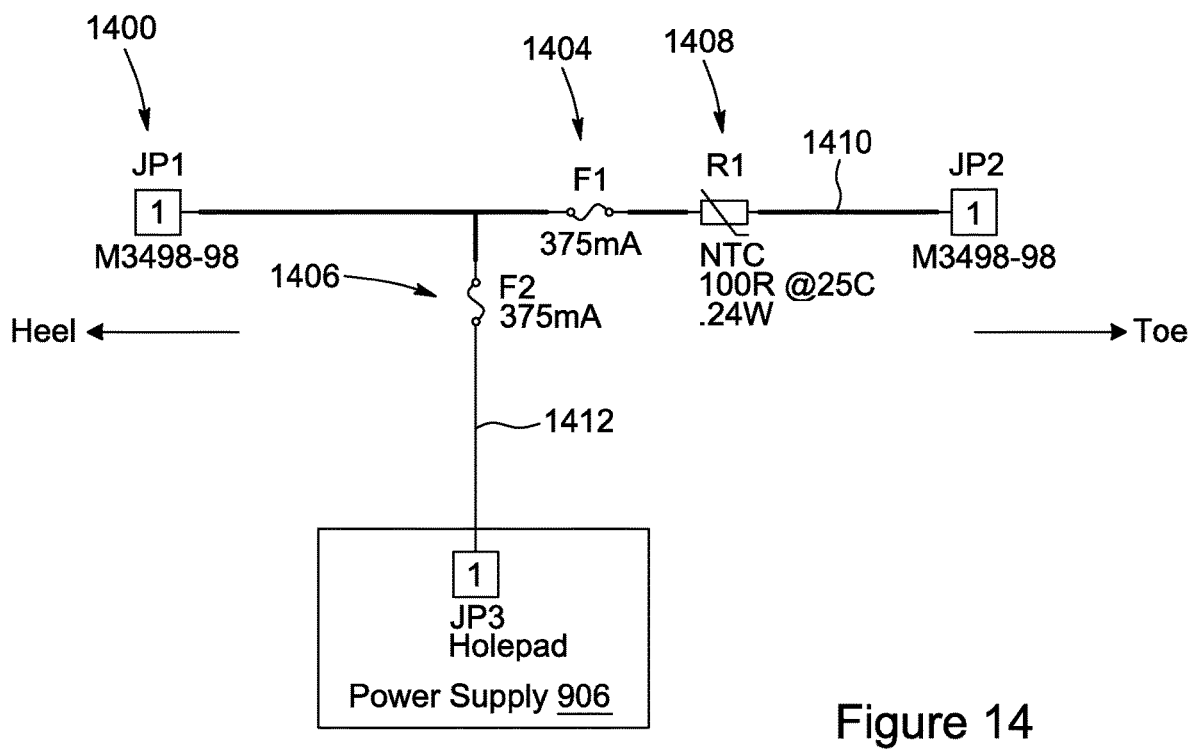
FIG. 14 is a general circuit diagram showing a line protection circuit of the control unit of FIG. 9.

FIG. 14 shows a line protection circuit 902 of the control unit of FIG. 9 in accordance with one embodiment of the present disclosure will be described. In accordance with the present disclosure, a number of line protection circuits 902 are connected in series, one for each flow communication station, to form a downhole fault protection system. As shown in FIG. 14, each line protection circuit 902 comprises a pair of fault condition triggered circuit interrupting devices. In the present example, the circuit interrupting devices are a pair of fuses comprising a first fuse 1404 and a second fuse 1406 that together can be used as circuit breakers to restore the operability of the injection well 104 in the event of a short circuit or control unit fault. Thus, the downhole fault protection system comprises a series of paired fuses, one pair for each flow communication station 110. The fuses are each triggered to interrupt current flow when current exceeds a respective fuse threshold amperage.

The first fuse 1404 is located in a main power-line 1410 and the second fuse 1406 is located in a branch line 1412 from the main power-line 1410 that extends to the power supply 906 of the control unit 900 for the respective flow communication station 110. In some examples, the amperage thresholds of the first fuse 1404 and the second fuse 1406 of each fuse pair is the same, although in other examples the amperage may be different. In some examples, the main power-line 1410 may also include a NTC (Negative temperature coefficient) thermistor 1414 adjacent to a first fuse 1404. An NTC thermistor 1414 is a resistor whose resistance is dependent on temperature. The NTC thermistor 1414 acts as a heater. The NTC thermistor 1414 of the line protection circuits 1400 are matched such that the operating temperatures of the first fuses 1404 differ by less than a threshold amount so that the first fuses 1404 at the flow communication stations have the same or similar operating temperatures, increasing the reliability and robustness of the downhole fault protection system when fuses having similar temperature characteristics are used. Although not shown, in other embodiments, a NTC thermistor may be located in each branch line 1412 adjacent to the second fuse 1406, the NTC thermistors in the branch lines 1412 being matched such that the operating temperatures of the second fuses 1406 differ by less than a threshold amount so that the second fuses 1406 at the flow communication stations 110 have the same or similar operating temperatures.

The threshold amperage of each pair of fuses is staggered (or stepped) and decreases from the heel to the toe of the injection well 104. Accordingly, the pair of fuses 1404, 1406 associated with flow control station 110A have greater threshold amperages than the pair of fuses associated with adjacent downhole flow control station 110B, and so on, with the pair of fuses associated with final flow control station 110E having the lowest threshold amperages. The difference in amperage of the first fuse 1404 or between the first fuses 1404 is selected to allow the sequential overloading/blowing of the first fuses 1404 from toe to the heel by steadily increasing the current in the line. Example differences in amperages between each pair of fuses is 50-200 mA, 100-150 mA and 100-110 mA, but this is variable depending on the tolerance of the fuses and available amperages, which may vary by manufacture, etc. When a short circuit, control unit fault or control unit failure occurs, the current in the main power-line can be steadily increased to sequentially trigger/blow the paired fuses from the toe to heel of the injection well 104 until the control unit having the short circuit, control unit fault or control unit failure is disconnected, and the operability of the injection well is restored. When the fuse associated with a valve having the short circuit or control unit fault or failure is blown, data flow from the remaining connected control units 900 will return and the operability of the injection well 104 is restored. However, all flow communication stations 110 downhole of the blown fuse will no longer be operable. The operator of the injection well 104 can decide whether to continue operating the injection string with the reduced number of flow communication stations 110, or whether to remove the injection string from the injection well 104 for inspection and repair of the short circuit, control unit fault or control unit failure.

Figure 15:
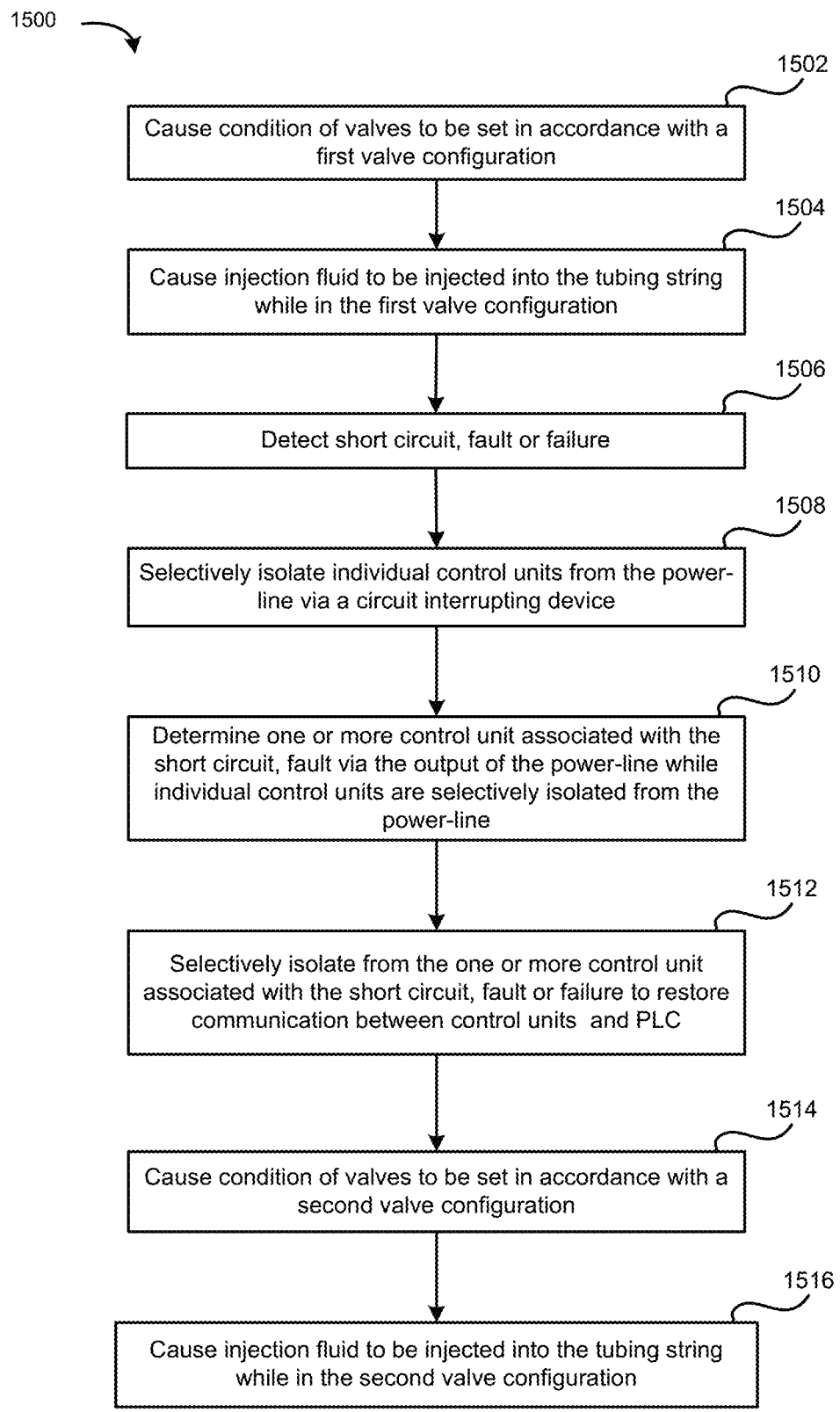
FIG. 15 is a flowchart of a method of fault detection and recovery in a tubing string located in a hydrocarbon well in accordance with one example embodiment of the present disclosure.

Referring to FIG. 15, a method 1500 of fault detection and recovery in a tubing string located in a hydrocarbon well in accordance with one example embodiment of the present disclosure will be described. The tubing string has a plurality of valves. Each valve has a control unit 900. Each control unit 900 is connected in series to a power-line providing power and communication. Each of the control units 900 is independently controllable. The method 1500 may be performed at least in part by the PLC 606, which is connected to the control units 900, and communicates with the control units 900 via half-duplex communication. The tubing string may be an injection string in some examples.

At operation 1502, causing a condition of the valves of the tubing string to be set in accordance with a first valve configuration. The first valve configuration is defined by a condition of the valves in which each valve in the plurality of valves is in either the fully open position or the fully closed position.

At operation 1504, an injection fluid is caused to be injected into the tubing string while in the first valve configuration.

At operation 1506, a short circuit, fault or failure is detected in one of the control units of the tubing string via an output of the power-line. The short circuit, fault or failure may be detected in response to a determination that one or more characteristics of the output of the power-line has changed by more than a threshold amount. The one or more characteristics of the output of the power-line may be a current of the power-line.

At operation 1508, individual control units are caused to be selectively isolated from the power-line via a circuit interrupting device. The individual control units may be selectively isolated in an isolation sequence. The isolation sequence may be from a toe to a heel of the hydrocarbon well.

At operation 1510, one or more control units associated with the short circuit, fault or failure are determined via the output of the power-line while individual control units are selectively isolated from the power-line.

At operation 1512, the one or more control units associated with the short circuit, fault or failure are selectively isolated from the power-line. As a result of this, communication between the control units 900 and the PLC 606 are restored.

At operation 1514, causing a condition of the valves of the tubing string to be set in accordance with a second valve configuration. The second valve configuration may be the same or different from the first valve configuration. The second valve configuration excludes as possibilities operating states in which the one or more control units associated with the short circuit, fault or failure selectively isolated from the power-line are controlled.

At operation 1514, causing a condition of the valves of the tubing string to be set in accordance with a second valve configuration. The second valve configuration may be the same or different from the first valve configuration. The second valve configuration excludes as possibilities operating states in which the one or more control unit associated with the short circuit, fault or failure selectively isolated from the power-line are controlled.

At operation 1516, an injection fluid is caused to be injected into the tubing string in accordance with a second valve configuration.

In some examples, each control unit 900 has a respective circuit interrupting device and the power-line comprises a main power-line and a plurality of branch power-lines connected to the main power-line. The control units 900 for the valves 202 are connected to a respective branch power-line. In some examples, each circuit interrupting device comprises: a first circuit interrupting device located in a main power-line to interrupt current in the main power-line when an amperage threshold is exceeded; and a second circuit interrupting device located in a respective branch line from the main power-line connected to a power supply of a respective control unit of a respective valve to interrupt current in the respective branch line when an amperage threshold is exceeded. The amperage thresholds of the first circuit interrupting device and second circuit interrupting device of each circuit interrupting device decreases in a descending order from a heel of the hydrocarbon well to a toe of the hydrocarbon well. The first circuit interrupting device and second circuit interrupting device may be fuses.

Figure 16:
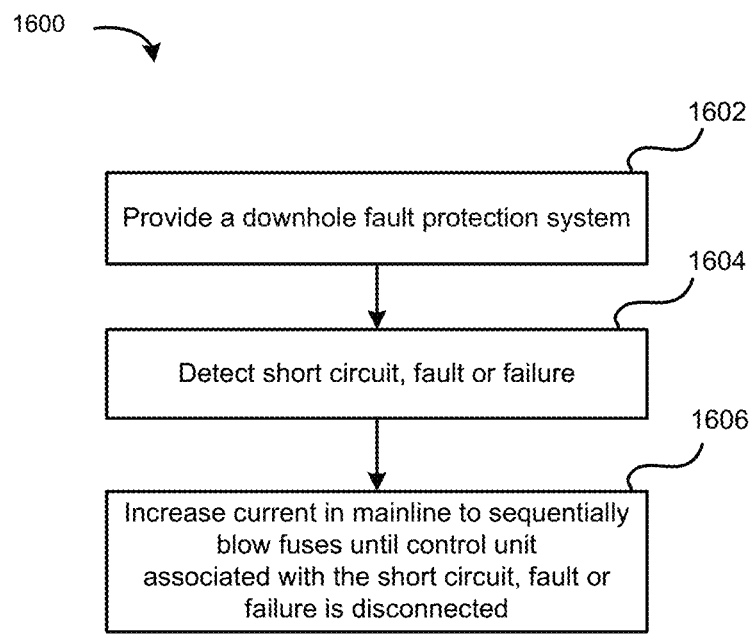
FIG. 16 is a flowchart of a method of downhole fault protection in accordance with one example embodiment of the present disclosure.

Referring to FIG. 16, a method 1600 of downhole fault protection in accordance with one example embodiment of the present disclosure will be described. First, a downhole fault protection system is provided (block 1602). The downhole fault protection system comprises a main power-line 1410 having a plurality of branch lines 1412 connected thereto, a control unit 900 for a valve 202 connected to each of the branch lines 1412, a line protection circuit 1400 for each of the control unit, each line protection circuit 1400 comprising a pair of fuses, a first fuse 1404 in each pair located in the main power-line 1410 and a second fuse 1416 in each pair located in a respective branch line 1412 from the main power-line that extends to a power supply 906 of the respective control unit 900 of a respective valve 202, wherein the amperage of the first fuse 1404 and second flise 1406 is the same, wherein the amperage of the pair of fuses in the line protection circuits 1400 decreases in a descending order from a heel of the injection well 104 to a toe of the injection well 104.

Next, a short circuit, control unit fault or control unit failure is detected, typically by a control system at the surface 102 (block 1604).

Next, a current in the main power-line is steadily increased to sequentially trigger the paired fuses from the toe to the heel of the injection well 104 until the control unit 900 having the short circuit, control unit fault or control unit failure is disconnected and the operability of the injection well 104 is restored (block 1606).

Although the foregoing description is based on an example application to an injection string in an injection well, the method of fault detection and recovery in a tubing string located in a hydrocarbon well, method of fault protection in a tubing string located in a hydrocarbon, apparatus and system described above may also be adapted for use in a production string in a production well.

General

The steps and/or operations in the flowcharts and drawings described herein are for purposes of example only. There may be many variations to these steps and/or operations without departing from the teachings of the present disclosure. For instance, the steps may be performed in a differing order, or steps may be added, deleted, or modified.

The coding of software for carrying out the above-described methods described is within the scope of a person of ordinary skill in the art having regard to the present disclosure. Machine-readable code executable by one or more processors of one or more respective devices to perform the above-described method may be stored in a machine-readable medium such as the memory of the data manager. The terms software and firmware are interchangeable within the present disclosure and comprise any computer program stored in memory for execution by a processor, comprising Random Access Memory (RAM) memory, Read Only Memory (ROM) memory, EPROM memory, electrically EPROM (EEPROM) memory, and non-volatile RAM (NVRAM) memory. The above memory types are examples only, and are thus not limiting as to the types of memory usable for storage of a computer program.

All values and sub-ranges within disclosed ranges are also disclosed. Also, although the systems, devices and processes disclosed and shown herein may comprise a specific plurality of elements, the systems, devices and assemblies may be modified to comprise additional or fewer of such elements. Although several example embodiments are described herein, modifications, adaptations, and other implementations are possible. For example, substitutions, additions, or modifications may be made to the elements illustrated in the drawings, and the example methods described herein may be modified by substituting, reordering, or adding steps to the disclosed methods.

Features from one or more of the above-described embodiments may be selected to create alternate embodiments comprised of a subcombination of features which may not be explicitly described above. In addition, features from one or more of the above-described embodiments may be selected and combined to create alternate embodiments comprised of a combination of features which may not be explicitly described above. Features suitable for such combinations and subcombinations would be readily apparent to persons skilled in the art upon review of the present application as a whole.

In addition, numerous specific details are set forth to provide a thorough understanding of the example embodiments described herein. It will, however, be understood by those of ordinary skill in the art that the example embodiments described herein may be practiced without these specific details. Furthermore, well-known methods, procedures, and elements have not been described in detail so as not to obscure the example embodiments described herein. The subject matter described herein and in the recited claims intends to cover and embrace all suitable changes in technology.

Although the present disclosure is described at least in part in terms of methods, a person of ordinary skill in the art will understand that the present disclosure is also directed to the various elements for performing at least some of the aspects and features of the described methods, be it by way of hardware, software or a combination thereof. Accordingly, the technical solution of the present disclosure may be embodied in a non-volatile or non-transitory machine-readable medium (e.g., optical disk, flash memory, etc.) having stored thereon executable instructions tangibly stored thereon that enable a processing device to execute examples of the methods disclosed herein.

The term processor may comprise any programmable system comprising systems using microprocessors/controllers or nanoprocessors/controllers, digital signal processors (DSPs), application specific integrated circuits (ASICs), field-programmable gate arrays (FPGAs) reduced instruction set circuits (RISCs), logic circuits, and any other circuit or processor capable of executing the functions described herein. The term database may refer to either a body of data, a relational database management system (RDBMS), or to both. As used herein, a database may comprise any collection of data comprising hierarchical databases, relational databases, flat file databases, object-relational databases, object oriented databases, and any other structured collection of records or data that is stored in a computer system. The above examples are example only, and thus are not intended to limit in any way the definition and/or meaning of the terms "processor" or database.

The present disclosure may be embodied in other specific forms without departing from the subject matter of the claims. The described example embodiments are to be considered in all respects as being only illustrative and not restrictive. The present disclosure intends to cover and embrace all suitable changes in technology. The scope of the present disclosure is, therefore, described by the appended claims rather than by the foregoing description. The scope of the claims should not be limited by the embodiments set forth in the examples, but should be given the broadest interpretation consistent with the description as a whole.

The invention claimed is:

1. A method of fault detection and recovery in a tubing string located in a hydrocarbon well, the tubing string having a plurality of valves, each valve having a control unit, each control unit being connected in series to a power-line providing power and communication, each of the control units being independently controllable, the method comprising:

detecting a short circuit, fault or failure in the tubing string via an output of the power-line, wherein the short circuit, fault or failure occurs in one of the control units of the tubing string;

causing individual control units to be selectively isolated from the power-line via a circuit interrupting device; and determining one or more control units associated with the short circuit, fault or failure via the output of the power-line while individual control units are selectively isolated from the power-line;

wherein the power-line comprises a main power-line and a plurality of branch power-lines connected to the main power-line;

wherein the control units for the valves are each connected to a respective branch power-line; and wherein each control unit has a respective circuit interrupting device comprising:

a first circuit interrupting device located in the main power-line to interrupt current in the main power-line when an amperage threshold is exceeded; and a second circuit interrupting device located in the respective branch power-line connected to a power supply of a respective control unit of a respective valve to interrupt current in the respective branch power-line when an amperage threshold is exceeded.

2. The method of claim 1, wherein the short circuit, fault or failure is detected in response to a determination that one or more characteristics of the output of the power-line has changed by more than a threshold amount.

3. The method of claim 2, wherein the one or more characteristics of the output of the power-line is a current of the power-line.

4. The method of claim 1, wherein the method is performed by a master controller coupled to the control units.

5. The method of claim 4, wherein the master controller is located above the hydrocarbon well.

6. The method of claim 4, wherein the control units communicate with the master controller via half-duplex communication.

7. The method of claim 4, wherein the master controller is a programmable logic controller.

8. The method of claim 1, wherein the tubing string is an injection string.

9. The method of claim 1, comprising:
after the determining one or more control units associated with the short circuit, fault or failure, restoring communication on the power-line by selectively isolating the one or more control units associated with the short circuit, fault or failure from the power-line.

10. The method of claim 9, comprising:
before detecting the short circuit, fault or failure:
causing a condition of the valves of the tubing string to be set in accordance with a first valve configuration; and
causing an injection fluid to be injected into the tubing string in accordance with a first valve configuration;
after the determining one or more control units associated with the short circuit, fault or failure:
causing a condition of the valves of the tubing string to be set in accordance with a second valve configuration, wherein the second valve configuration excludes as possibilities operating states in which the one or more control units associated with the short circuit, fault or failure selectively isolated from the power-line are controlled; and
causing the injection fluid to be injected into the tubing string in accordance with the second valve configuration,
wherein each of the first valve configuration and second valve configuration is defined by a condition of the valves in which each valve in the plurality of valves is in either the fully open position or the fully closed position.

11. The method of claim 1, wherein the individual control units are selectively isolated in an isolation sequence.

12. The method of claim 11, wherein the isolation sequence is from a toe to a heel of the hydrocarbon well.

13. The method of claim 1, wherein the amperage thresholds of the first circuit interrupting device and second circuit interrupting device of each circuit interrupting device decreases in a descending order from a heel of the hydrocarbon well to a toe of the hydrocarbon well.

14. A controller for controlling control units of a tubing string located in a hydrocarbon well, the tubing string having a plurality of valves, each valve having a control unit, each control unit being connected in series to a power-line providing power and communication, each of the control units being independently controllable, the controller comprising:
a processor; and
a memory coupled the at least one processor, the memory having tangibly stored thereon executable instructions for execution by the processor that, when executed by the processor, cause the controller to:
detect a short circuit, fault or failure in the tubing string via an output of the power-line, wherein the short circuit, fault or failure occurs in one of the control units of the tubing string;
cause individual control units to be isolated from the power-line via a circuit interrupting device; and
determine one or more control units is associated with the short circuit, fault or failure via the output of the power-line while individual control units are isolated from the power-line;
wherein the power-line comprises a main power-line and a plurality of branch power-lines connected to the main power-line;
wherein the control units for the valves are each connected to a respective branch power-line; and
wherein each control unit has a respective circuit interrupting device comprising:
a first circuit interrupting device located in the main power-line to interrupt current in the main power-line when an amperage threshold is exceeded; and
a second circuit interrupting device located in the respective branch line connected to a power supply of a respective control unit of a respective valve to interrupt current in the respective branch line when an amperage threshold is exceeded.

15. A downhole fault protection system for a tubing string located in a hydrocarbon well, the tubing string having a plurality of valves, each valve having a control unit, each control unit being connected in series to a power-line providing power and communication, each of the control units being independently controllable, the system comprising:
a main power-line having a plurality of branch lines connected thereto;
a control unit for a valve connected to each of the branch lines;
a line protection circuit for each of the control units, each line protection circuit comprising a pair of circuit interrupting devices, a first circuit interrupting device in each pair located in the main power-line to interrupt current in the main power-line when an amperage threshold is exceeded and a second circuit interrupting device in each pair located in a respective branch line from the main power-line that extends to a power supply of a respective control unit of a respective valve to interrupt current in the respective branch line when an amperage threshold is exceeded;
wherein the amperage thresholds of the first and second circuit interrupting devices decreases in a descending order from a heel of the hydrocarbon well to a toe of the hydrocarbon well, enabling valves to be selectively isolated in order from the toe to the heel by increasing a current applied to the line protection circuits.

16. The downhole fault protection system of claim 15, wherein the difference in amperage thresholds between adjacent pair of circuit interrupting devices is 50-200 mA, preferably 100-150 mA, and more preferably 100-110 mA.

17. The downhole fault protection system of claim 15, wherein the line protection circuit further comprises a NTC (Negative temperature coefficient) thermistor adjacent to the first circuit interrupting device in the main power-line, wherein the NTC thermistor of the line protection circuits are matched such that the operating temperatures of the first circuit interrupting devices differ by less than a threshold amount.

18. The downhole fault protection system of claim 15, wherein the first and circuit interrupting devices are fuses.

19. A downhole fault protection system for multiple stages of downhole valves in a well, comprising:
 a main power-line having a plurality of branch lines connected thereto;
 a control unit for a valve connected to each of the branch lines;
 a line protection circuit for each of the control units, each line protection circuit comprising a circuit interrupting device for isolating the valve from the main power-line when an amperage threshold at the control unit is exceeded;
 wherein the amperage thresholds of the circuit interrupting devices decreases in a descending order from a heel of the hydrocarbon well to a toe of the hydrocarbon well, enabling valves to be selectively isolated in order from the toe to the heel by increasing a current applied to the line protection circuits.

20. A method of fault detection and recovery in a tubing string located in a hydrocarbon well, the tubing string having a plurality of valves, each valve having a control unit, each control unit being connected in series to a power-line providing power and communication, each of the control units being independently controllable, the method comprising:
 causing a condition of the valves of the tubing string to be set in accordance with a first valve configuration;
 causing an injection fluid to be injected into the tubing string in accordance with a first valve configuration;
 detecting a short circuit, fault or failure in the tubing string via an output of the power-line, wherein the short circuit, fault or failure occurs in one of the control units of the tubing string;
 causing individual control units to be selectively isolated from the power-line via a circuit interrupting device;
 determining one or more control units associated with the short circuit, fault or failure via the output of the power-line while individual control units are selectively isolated from the power-line;
 restoring communication on the power-line by selectively isolating the one or more control units associated with the short circuit, fault or failure from the power-line;
 causing a condition of the valves of the tubing string to be set in accordance with a second valve configuration, wherein the second valve configuration excludes as possibilities operating states in which the one or more control units associated with the short circuit, fault or failure selectively isolated from the power-line are controlled; and
 causing the injection fluid to be injected into the tubing string in accordance with the second valve configuration,
 wherein each of the first valve configuration and second valve configuration is defined by a condition of the valves in which each valve in the plurality of valves is in either the fully open position or the fully closed position.

* * * * *